(12) United States Patent
Zhang et al.

(10) Patent No.: US 9,024,415 B2
(45) Date of Patent: May 5, 2015

(54) ELECTRICAL AND OPTICAL DEVICES INCORPORATING TOPOLOGICAL MATERIALS INCLUDING TOPOLOGICAL INSULATORS

(75) Inventors: Shoucheng Zhang, Stanford, CA (US); Xiao Zhang, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 88 days.

(21) Appl. No.: 13/312,942

(22) Filed: Dec. 6, 2011

(65) Prior Publication Data

US 2012/0138887 A1   Jun. 7, 2012

Related U.S. Application Data

(60) Provisional application No. 61/420,486, filed on Dec. 7, 2010.

(51) Int. Cl.

| | | |
|---|---|---|
| H01L 29/82 | (2006.01) | |
| H01L 43/08 | (2006.01) | |
| H01F 1/40 | (2006.01) | |
| H01L 31/08 | (2006.01) | |
| H01F 1/00 | (2006.01) | |

(52) U.S. Cl.
CPC .............. *H01L 43/08* (2013.01); *H01F 1/0009* (2013.01); *H01F 1/401* (2013.01); *H01L 31/08* (2013.01)

(58) Field of Classification Search
CPC ......................... H01L 29/66977; H01L 33/025
USPC .............. 257/9, 2, 3, 629, E29.168, E29.323; 372/43.01
See application file for complete search history.

(56) References Cited

U.S. PATENT DOCUMENTS

| | | |
|---|---|---|
| 7,037,807 B1 | 5/2006 | Murakami et al. |
| 7,105,390 B2 * | 9/2006 | Brask et al. ................... 438/149 |
| 7,428,128 B2 | 9/2008 | Hasegawa et al. |
| 2004/0013880 A1 | 1/2004 | Daughton et al. |
| 2004/0252417 A1 | 12/2004 | Hasegawa et al. |

(Continued)

FOREIGN PATENT DOCUMENTS

WO     2007081381 A3    7/2007

OTHER PUBLICATIONS

M.Z. Hasan et al., "Topological Insulators" Department of Physics, Princeton University, Nov. 9, 2010, Cornell University Library, p. 1-23.*

(Continued)

*Primary Examiner* — Minchul Yang
(74) *Attorney, Agent, or Firm* — Patent Law Group LLP; Brian D. Ogonowsky

(57) ABSTRACT

An electrical device includes a current transport layer formed using a layer of a topological material selected from the group of a topological insulator, a quantum anomalous hall (QAH) insulator, a topological insulator variant, and a topological magnetic insulator. In one embodiment, the current transport layer forms a conductive wire on an integrated circuit where the conductive wire includes two spatially separated edge channels, each edge channel carrying charge carriers propagating in one direction only. In other embodiments, an optical device includes an optical layer formed using a layer of the topological material. The optical layer can be a light absorbing layer, a light emitting layer, a light transport layer, or a light modulation layer.

19 Claims, 8 Drawing Sheets

(56) References Cited

U.S. PATENT DOCUMENTS

| | | | |
|---|---|---|---|
| 2005/0094470 A1 | 5/2005 | Ikarashi | |
| 2008/0267557 A1 | 10/2008 | Wang et al. | |
| 2008/0268288 A1 | 10/2008 | Jin | |
| 2010/0090759 A1 | 4/2010 | Shin et al. | |
| 2010/0140723 A1 | 6/2010 | Kurtz et al. | |
| 2010/0163285 A1 | 7/2010 | Marinero | |

OTHER PUBLICATIONS

Judy J. Cha et al., "Magnetic Doping and Kondo Effect in BiSe Nanoribbons" 2010, Nano Letters, amaerican checmical Society, 10, 1076-1081 http://www.stanford.edu/group/cui_group/papers/nl100146n.pd, p. 1076-1081.*

Jason Alicea et al., "Non Abelian statistics and quantum information processing in 1D wire networks" Sep. 19, 2010, Cornell University, p. 1-23.*

Pavan Hosur, "Optical characterization of topological insulator surface state: Berry curvature-dependent response" Department of Physics, University of California, Berkeley, Jun. 25, 2010, http://arxiv.org/pdf/1006.5046v1.pdf, p. 1-7.*

Liang Fu et al., "Topological Insulators in Three Dimensions" 2007, Physical Review Letters, PRL 98, 106803, p. 106803-1-106803-4.*

Xio-Lang Qi et al., "Inducing a Magnetic Monopole with Topological Surface States" Feb. 27, 2009, Science, vol. 323, p. 1184-1187.*

Liang Fu et al., "Topological Insulators with Inversion Symmetry" Department of Physics and Astronomy, University of Pennsylvania, Jul. 11, 2007, p. 045302-1-045302-17.*

Xiao-Liang Qi et al.,"Topological field theory of time reversal invariant insulators" 2008, The American Physical Society Physical Review B 78, 195424, p. 195424-1-95424-43.*

Rundong Li et al., "Dynamical Axion Field in Topological Magnetic Insulators" Department of Physics, McCullough Building, Stanford University,Aug. 11, 2009, p. 284-288.*

Rui Yu et al., "Quantized Anomalous Hall Effect in Magnetic Topological Insulators" Jul. 2, 2010, Science vol. 329, p. 61-64.*

Tatiana V. Lobanova et al., "The Modern Technology for Slicon NanoFET" Jul. 1, 2006, International Siberian Workshop and Tutorial EDM, ISSN 1815-3712 ISBN 5-7782-0646-1, Novosibirsk State Technical University, p. 27-29.*

Xiao-Liang Qi et al., "The quantum spin Hall effect and topological insulators" Jan. 2010, Physics Today, p. 33-38.*

Xiao Zhang et al., "Topological Insulators for high performance terahertz to infrared applications" 2010, Physical Review B 82, 245107, The American Physical Society, p. 245107-1-245107-5.*

Desalegne Teweldebrhan et al., "Exfoliation and Characterization of Bismuth Telluride Atomic Quintuples and Quasi Two Dimensional Crystals" Mar. 5, 2010, Nano Letters 2010, 10, American Chemical Society, http://ndl.ee.ucr.edu/Balandin-NL-BiTe.pdf, p. 1209-1218.*

Keun Soo Kim et al., "Large scale pattern growth of graphene films for strechable transparent electrodes" Feb. 5, 2009, Nature, vol. 457 http://www.nature.com/nature/journal/v457/n7230/pdf/nature07719.pdf, p. 706-710.*

Burkov (Phys. Rev. Lett. 105, 066802, Spin and Charge Transport on the surface of a Topological Insulator, p. 1-4).*

Roth et al., Science 325, 2009, pp. 294-297.*

Yu et tal. Science, 329, 2010, pp. 61-64.*

International Search Report and Written Opinion, 11 pages.

Li et al., "Dynamical Axion Field in Topological Magnetic Insulators," Nature Physics, Aug. 11, 2009, downloaded from http://arxiv.org/pdf/0908.1537.pdf, 5 pages.

Brumfiel, G., "Star Material," Nature, vol. 466, Jul. 15, 2010, pp. 310-311.

Fu, L. et al., "Topological Insulators with Inversion Symmetry," arXiv:cond-mat/0611341v2, Jul. 11, 2007, 17 pages.

Fu, L. et al., "Topological Insulators in Three Dimensions," arXiv:cond-mat/0607699v2, Jul. 11, 2007, 4 pages.

Zhang, H. et al., "Topological insulators in Bi2Se3, Bi2Te3 and Sb2Te3 with a single Dirac cone on the surface," Nature Physics, DOI: 10.1038/NPHYS1270, Published Online May 10, 2009, pp. 1-5.

Zhang, X. et al., "Topological insulators for high-performance terahertz to infrared applications," The American Physical Society, Physical Review B 82, 245107, Dec. 8, 2010, 5 pages.

Hor et al., "p-type Bi2Se3 for topological insulator and low temperature thermoelectric applications" Physical Review B 79, 195208 (2009).

Zhang et al., "Quintuple-layer epitaxy of high-quality Bi2Se3 thin films for topological insulator" Applied Physics letters 95, 053114 (2009).

Hirahara et al., "Anomalous transport in an n-type topological insulator ultrathin Bi2Se3 film" Physical Review B 82, 155309 (2010).

Park et al., "Quasi-particle scattering and protected nature of the topological states in a parent topological insulator Bi2Se3" Physical Review B 81, 041405(R) (2010).

JK Furdyna, "Diluted magnetic semiconductors", AIP Journal of Applied Physics, Aug. 15, 1988, pp. R29-R64, American Institute of Physics, <http://scitation.aip.org/content/aip/journal/jap/64/4/10.1063/1.341700>.

Yao-Yi Li et al., "Intrinsic Topological Insulator Bi2Te3 Thin Films on Si and Their Thickness Limit", Advanced Materials, Sep. 22, 2010, vol. 22, issue 36, pp. 4002-4007, Wiley-Vch Verlag GmbH & Co. KGaA, Winheim, Germany, <http://onlinelibrary.wiley.com/doi/10.1002/adma.201000368/abstract:jsessionid=54D8949B5550DD537F7B9A119D4F5269.f04t02?deniedAccessCustomised Message=&userIsAuthenticated=false>.

Yao-Yi Li et al., "Growth dynamics and thickness-dependent electronic structure of topological insulator Bi2Te3 thin films on Si", Dec. 27, 2009, Cornell University Library, eprint arXiv:0912.5054, <http://arxiv.org/abs/0912.5054>.

V.A. Kulbachinskii et al. "Anomalous transport and ferromagnetism in the diluted magnetic semiconductor Sb2-xCrxTe3", Nov. 1, 2005, Physica B: Condensed Matter, pp. 32-41, vol. 368, Elsevier B.V., <http://www.sciencedirect.com/science/article/pii/S0921452605008501>.

A. Giani et al., "Elaboration of Bi2Te3 by metal organic chemical vapor deposition", Thin Solid Films, Jul. 15, 1997, pp. 1-3, vol. 303, issues 1-2, Elsevier Science S.A., <http://www.sciencedirect.com/science/article/pii/S0040609097000898>.

Yi-Jiunn Chien et al., "Growth and transport properties of Sb2-xVxTe3 thin films on sapphire substrates", Journal of Crystal Growth, Oct. 1, 2005, pp. 309-314, vol. 283, issues 3-4, Elsevier B.V., <http://www.sciencedirect.com/science/articlelpii/S0022024805007475>.

Y. Iwata et al., "In situ reflection high-energy electron diffraction(RHEED) observation of Bi2Te3/Sb2Te3 multilayer film growth", Journal of Crystal Growth, Jan. 1999, pp. 125-130, vol. 203, Elsevier Science B.V., <http://www.researchgate.net/publication/244256957_In_situ_reflection_high-energy_electron_diffraction_(RHEED)_observation_of Bi_2Te_3Sb_2Te_3_multilayer_film_growth>.

Vladimir A. Kulbachinskii et al., "Low temperature ferromagnetism in the new diluted magnetic semiconductor p-Bi2-xFexTe3", Physica B: Condensed Matter, May 2003, pp. 1251-1252, vol. 329-333, Elsevier Science B.V., <http://www.sciencedirect.com/science/article/pii/S0921452602022123>.

E. Charles et al., "Structural and electrical properties of bismuth telluride films grown by the molecular beam technique", Journal of Materials Science Letters, Jun. 1, 1988, pp. 575-577, vol. 7, issue 6, Chapman and Hall Ltd. <http://link.springer.com/article/10.1007/BF01730298#>.

J.S.Dyck et al., "Low temperature ferromagnetic properties of the diluted magnetic semiconductor Sb2-xCrxTe3", Physical Review B, Mar. 2005, vol. 71, issue 11, <http://arxiv.org/abs/cond-mat/0409403>.

Jeffrey S. Dyck, "Diluted magnetic semiconductors based on Sb2-xVxTe3", Physical Review B, Mar. 2002, vol. 65, issue 11, The American Physical Society, <http://www.egr.msu.edu/efrc/diluted-magnetic-semiconductors-based-sb2-xvxte3>.

(56) References Cited

OTHER PUBLICATIONS

Can-Li Song et al., "Topological insulator Bi2Se3 thin films grown on double-layer graphene by molecular beam epitaxy", Applied Physics Letters, Oct. 2010, vol. 97, issue 14, American Institute of Physics, <http://adsabs.harvard.edu/cgi-bin/bib_query?arXiv:1007.0809>.

Yi-Jiunn Chien, "Transition Metal-Doped Sb2Te3 and Bi2Te3 Diluted Magnetic Semiconductors", Doctoral Dissertation, 2007, Yi-Jiunn Chien, University of Michigan, <http://deepblue.lib.umich.edu/handle/2027.42/57593>.

A.A. Burkov et al., "Spin and Charge Transport on the Surface of a Topological Insulator", Physical Review Letters, Aug. 2010, pp. 1-4, vol. 105, issue 6, <http://arxiv.org/abs/1005.1654>.

SIPO search report for CN Application 201180058692.X filed Jun. 6, 2013, 2 pages.

* cited by examiner

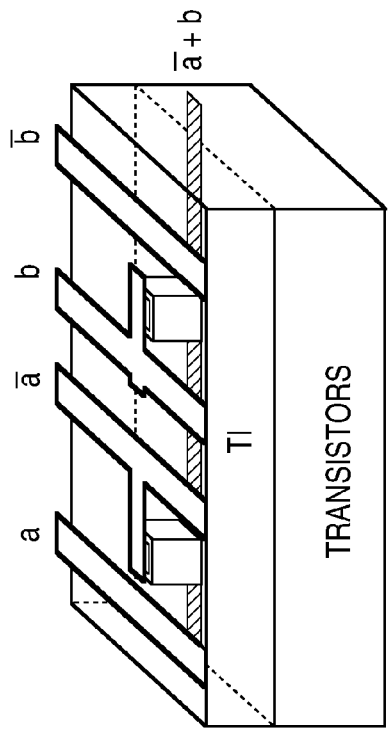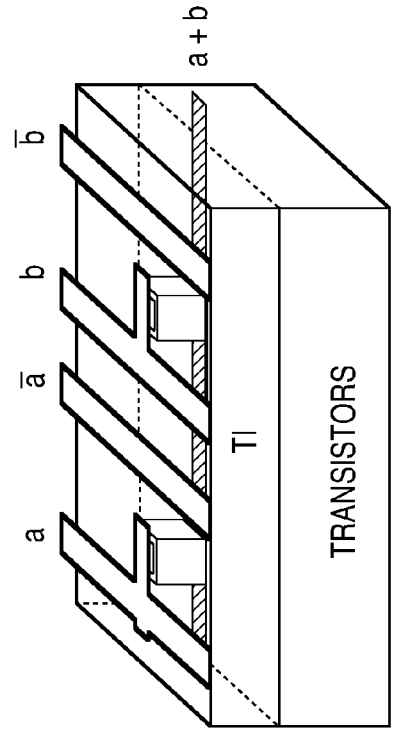
FIG. 3(a)          FIG. 3(b)
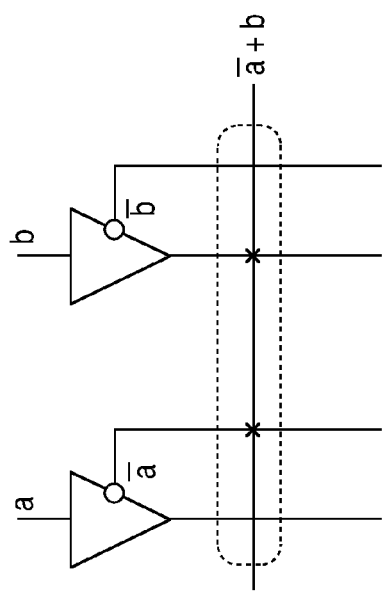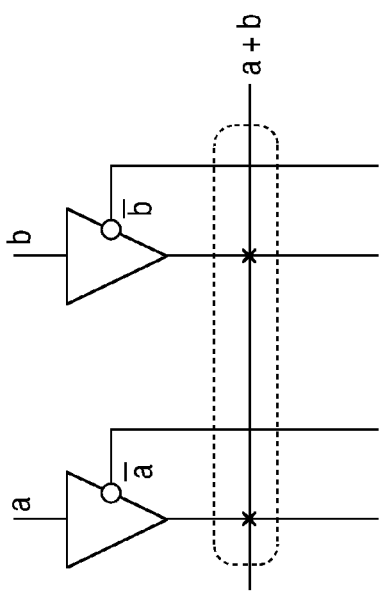

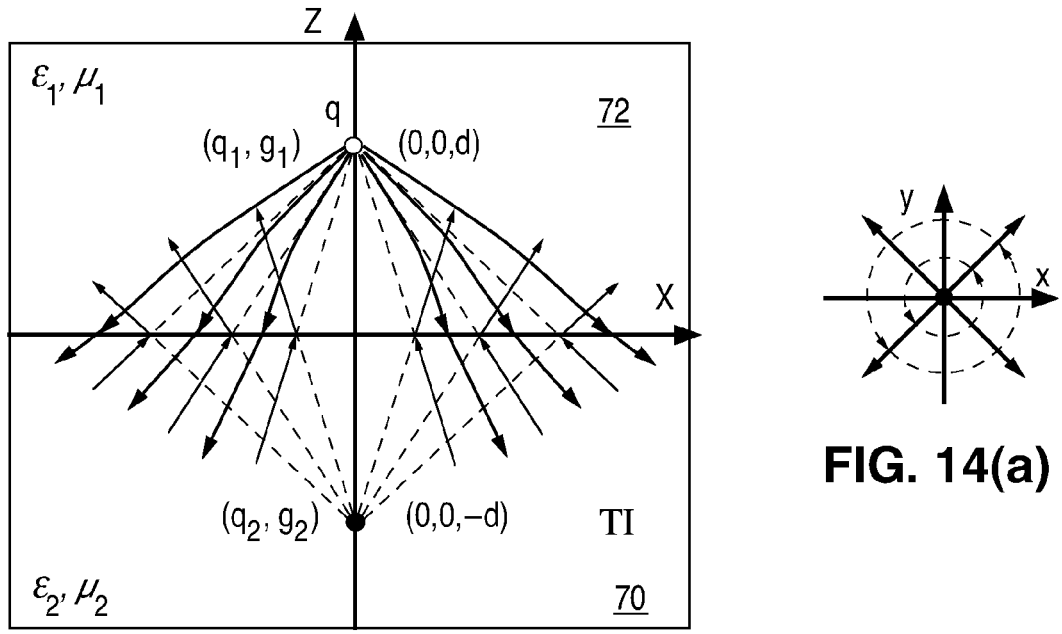
FIG. 14
FIG. 14(a)
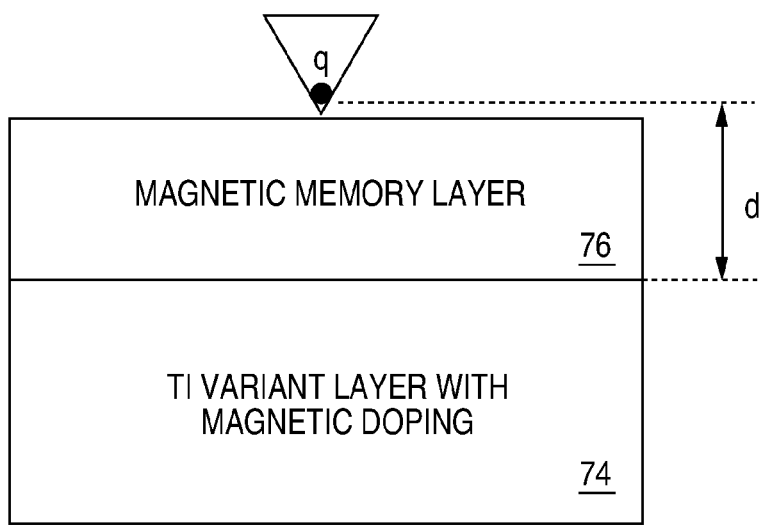
FIG. 15

ELECTRICAL AND OPTICAL DEVICES INCORPORATING TOPOLOGICAL MATERIALS INCLUDING TOPOLOGICAL INSULATORS

CROSS-REFERENCE TO RELATED APPLICATIONS

This application claims the benefit of U.S. Provisional Patent Application Ser. No. 61/420,486, filed on Dec. 7, 2010, which application is incorporated herein by reference in its entirety.

FIELD OF THE INVENTION

The invention relates to electrical devices and optical devices incorporating topological material, such as topological insulators, and, in particular, to an electrical device formed using a topological material, such as a topological insulator, as a current transport layer or an optical device formed using a topological material, such as a topological insulator, as a light absorbing layer, a light emitting layer, a light transport layer, or a light modulation layer.

DESCRIPTION OF THE RELATED ART

Topological insulators (TI) are a new state of quantum matter with an insulating bulk gap and gapless edge or surface states interesting for condensed matter physics, material science and electrical engineering. The two-dimensional (2D) TI, with quantum spin Hall (QSH) effect has been predicted and observed in HgTe/CdTe quantum well (Science 314, 1757 (2006); Science 318, 766 (2007); Science 325, 294 (2009)). Following that, three-dimensional (3D) TI such as strained HgTe, $Bi_xSb_{1-x}$, $Sb_2Te_3$, $Bi_2Te_3$, $Bi_2Se_3$, $TlBiTe_2$, $TlBiSe_2$, selected ternary Heusler compounds, and selected chalcogenides, including $Ge_1Bi_4Te_7$, $Ge_2Bi_2Te_5$, and $Ge_1Bi_2Te_4$ are discovered. In particular, three-dimensional (3D) TI such as $Bi_2Se_3$ and $Bi_2Te_3$ were theoretically predicted (Nature Physics 5,438 (2009)) to have bulk energy gap as large as 0.3eV, and gapless surface states consisting of a single Dirac cone. $Bi_2Se_3$ and $Bi_2Te_3$ are stoichiometric rhombohedral crystals with layered structure consisting of stacked quintuple layers (QLs), with relatively weak Van der waals coupling between QLs (each QL is about 1nm thick). Therefore, high quality thin films have been successfully grown on silicon, silicon dioxide, silicon nitride and silicon carbide substrates using various semiconductor processing techniques with precise thickness control, which enables further scientific study and applications integratable with today's electronics. Recently, more and more novel topological materials have been predicted and under experimental realization, including topological insulators with strong interaction such as AmN, PuTe (See X. Zhang et al., "Actinide Topological Insulator Materials with Strong Interaction," arXiv:1111.1267v1 [cond-mat.str-el], published Nov. 4, 2011), quantum anomalous hall insulators such as Mn doped HgTe quantum well, Cr/Fe doped $Bi_2Se_3$/$Bi_2Te_3$/$Sb_2Te_3$ and $GdBiTe_3$ quantum well (see H. Zhang et al., "Quantum Anomalous Hall Effect in Magnetic Topological Insulator GdBiTe3," arXiv:1108.4857v1 [cond-mat.mes-hall], published Aug. 19,2011), and topological magnetic insulators. All these novel topological materials have unique physical properties and potential applications in electronic and optical devices.

SUMMARY OF THE INVENTION

According to one embodiment of the present invention, an electrical device includes a current transport layer formed using a layer of a topological material, the topological material being selected from the group of a topological insulator, a quantum anomalous hall (QAH) insulator, a topological insulator variant, and a topological magnetic insulator. The topological insulator and the QAH insulator both have an insulating energy band gap in the bulk and conducting edge or surface states, the topological insulator variant is formed from a topological insulator material, and the topological magnetic insulator is an antiferromagnetic insulator. The electrical device further includes at least one electrode in electrical contact with the current transport layer.

In one embodiment, the current transport layer forms a conductive wire on an integrated circuit being configured as an interconnect between a signal source and a first terminal of a load. The conductive wire includes two spatially separated edge channels where each edge channel carries charge carriers propagating in one direction only and the two edge channels carry charge carriers propagating in opposite directions.

In another embodiment, the layer of a topological material is used to form the channel region of a transistor.

According to another embodiment of the present invention, an optical device includes an optical layer formed using a layer of a topological material, the topological material being selected from the group of a topological insulator, a quantum anomalous hall (QAH) insulator, a topological insulator variant, and a topological magnetic insulator. The topological insulator and the QAH insulator both have an insulating energy band gap in the bulk and conducting edge or surface states, the topological insulator variant is formed from a topological insulator material, and the topological magnetic insulator is an antiferromagnetic insulator. The optical layer is one of a light absorbing layer, a light emitting layer, a light transport layer, or a light modulation layer.

The present invention is better understood up on consideration of the detailed description below and the accompanying drawings.

BRIEF DESCRIPTION OF THE DRAWINGS

FIGS. 3(a) and 3(b) illustrate a reprogrammable architecture integrating transistors and the axion string interconnect according to one embodiment of the present invention.

FIG. 14 illustrates the image electric charge and monopole of a point-like electric charge in a topological insulator variant layer according to embodiments of the present invention. The insert FIG. 14(*a*) illustrates the top view of the topological insulator variant layer and the in-plane components of the electric field and surface current.

FIG. 15 is a cross-sectional view of a magnetic memory device incorporating a topological insulator variant layer according to one embodiment of the present invention.

DETAILED DESCRIPTION OF THE PREFERRED EMBODIMENTS

Figure 1A:
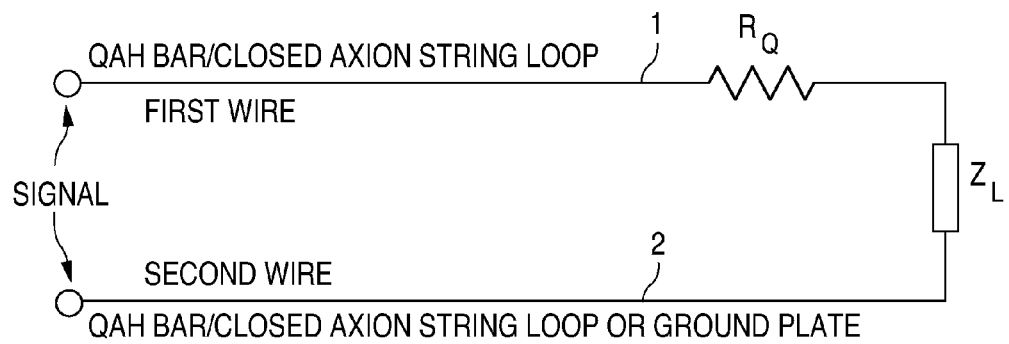
FIG. 1(a) illustrates a circuit model for an autobahn interconnect device according to one embodiment of the present invention.

In accordance with the principles of the present invention, an electrical device incorporates a layer of a topological material as a current transport layer. The electrical device includes at least one electrode in electrical contact with the current transport layer. According to another aspect of the present invention, an optical device incorporates a layer of a topological material as a light absorbing layer, a light emitting layer, a light transport layer, or a light modulation layer. In one embodiment, the layer of the topological material may form a light transport layer where the topological material alters the polarization of the incident light. An optical device thus constructed may be operated by tracing the rotation angle of the polarization of the incident light carried in the layer of topological material.

In the present description, the term "topological material" is used to refer collectively to a group of materials including topological insulators, variations or variants of the topological insulators, quantum anomalous hall (QAH) insulators, and topological magnetic insulators. In embodiments of the present invention, variants of topological insulators are constructed by thickness control, by magnetic doping, or by applied electric field, as will be explained in more details below.

(1) Topological Insulators

In the present description, a topological insulator (TI), in two or three dimensions, is a material having insulating energy gaps in the bulk and gapless edge or surface states on the material boundary that are protected by time-reversal symmetry. That is, a topological insulator is a material with a bulk insulating energy gap and a conducting surface state or edge state protected from any time reversal invariant perturbation. In the present description, a gapless edge or surface state refers to an edge state or surface state having a zero energy band gap. In other words, a topological insulator is a material that behaves as an insulator in its interior while permitting the movement of charges on its boundary.

Accordingly, in the present description, a topological insulator refers to a material with an insulating bulk and a conducting edge or a conducting surface. That is, the surface states of the 3D topological insulator layer are gapless or have negligible energy band gap. The surface of such a 3D topological insulator behaves as a conductor supporting current transport. Meanwhile the bulk of the 3D topological insulator layer behaves as an insulator. In the case of the two-dimensional (2D) topological insulator, the edge of the 2D topological insulator behaves as a conductor while the bulk behaves as an insulator.

(2) Variants of Topological Insulators

According to embodiments of the present invention, variants of the topological insulators are constructed by controlling the thickness of the topological insulator layer, by using magnetic doping, or by using an applied electric field.

(a) Thickness Control. In embodiments of the present invention, variants of topological insulators are formed by controlling or varying the thickness of the topological insulator layer being formed. More specifically, 2D or 3D topological insulator layers may be formed with varying thickness to construct topological insulator variants having different electrical properties.

In one embodiment, a variant of a two-dimensional (2D) topological insulator is formed from a 2D topological insulator layer by varying the thickness of the 2D topological insulator layer. When the thickness of the 2D topological insulator variant layer is increased or decreased, at certain thicknesses, the edge states of the 2D topological insulator layer disappear so that the entire 2D TI variant becomes a trivial insulator. Furthermore, when the 2D topological insulator has a thickness close to the critical thickness, the 2D TI variant becomes gapless or close to gapless throughout the edge and the bulk and the 2D TI variant layer behaves as a conductor even at low temperature.

Accordingly, in the present description, a 2D topological insulator refers to a material with an insulating bulk and a conducting edge. Furthermore, a 2D topological insulator variant with thickness control refers to a material formed by varying the thickness of a 2D topological insulator layer to modulate the edge conductivity or the energy gap of the 2D topological insulator layer. At certain thicknesses, the edge states of a 2D topological insulator are gone and the 2D topological insulator variant becomes a trivial insulator. However, when the thickness of a 2D TI layer is close to the critical thickness, the surface becomes a conductor.

In another embodiment, a variant of a three-dimensional (3D) topological insulator is formed from a 3D topological insulator layer with reduced thickness, such as less than tens of nanometer. The 3D topological insulator variant becomes a two-dimensional (2D) insulator and may behave as a 2D topological insulator or a 2D trivial insulator. More specifically, the surface states of the 3D topological insulator variant become gapped or have appreciable energy band gap. Furthermore, when the 2D insulator formed from the 3D topological insulator with a reduced thickness is close to the critical thickness, the 3D TI variant becomes gapless or close to gapless throughout the surface and the bulk and the 3D TI variant layer behaves as a conductor even at low temperature.

Accordingly, in the present description, a 3D topological insulator refers to a material with an insulating bulk and a conducting surface. Furthermore, a 3D topological insulator variant with thickness control refers to a material formed by reducing the thickness of a 3D topological insulator layer to modulate the surface conductivity or the energy gap of the 3D topological insulator layer. At certain thicknesses, the surface states of a 3D topological insulator becomes a 2D insulator. However, when the thickness of a 3D TI layer is close to the critical thickness of the 2D insulator formed therefrom, the surface becomes a conductor.

(b) Magnetic doping. In embodiments of the present invention, variants of 3D topological insulators are formed by doping the 3D topological insulator layer using magnetic impurities. The surfaces states of the 3D topological insulator variant become insulating with a gapped energy band or an appreciable energy band gap. In embodiments of the present invention, a 3D TI variant with magnetic doping is formed by surface doping. In other embodiments, a 3D TI variant with magnetic doping is formed by doping the surface and the bulk of a 3D topological insulator layer.

As discussed above, the topological protection of the surface states of 3D topological insulators is based on time-reversal symmetry. Nonmagnetic impurities do not break time-reversal symmetry, and therefore do not destroy the topological protection of the surface states. However, when a 3D topological insulator is surface-doped with magnetic impurities such as iron, or covered by magnetic materials, exchange coupling between the impurities generates a finite magnetization on the surface. This magnetization breaks time-reversal symmetry on the surface of the topological insulators, which opens up a gap in the energy spectrum of the surface states. (See, Phys. Rev. Lett. 102, 156603 (2009)). Thus, for a 3D topological insulator surface-doped with magnetic impurities, the surface states of the 3D topological insulator variant become gapped or have appreciable energy band gap. Such a 3D TI variant will exhibit topological magnetoelectric effect that is essential for many applications. (See, Phys. Rev. B, Vol. 78, p. 195424 (2008)).

(c) Applied Electric Field. When a 3D topological insulator variant is formed with reduced thickness, the surface of the 3D topological insulator variant becomes a gaped energy band insulator or semiconductor where the conductivity of the surface states can be modulated by an applied potential. That is, the surface of the 3D topological insulator variant behaves as an insulator material with a tunable band gap.

Known materials for forming a topological insulator layer include: HgTe, $Bi_xSb_{1-x}$, $Sb_2Te_3$, $Bi_2Te_3$, $Bi_2Se_3$, $TlBiTe_2$ and $TlBiSe_2$. A topological insulator can also be formed using selected ternary Heusler compounds or selected chalcogenides, such as $Ge_1Bi_4Te_7$, $Ge_2Bi_2Te_5$, and $Ge_1Bi_2Te_4$. Other materials or compounds for forming a topological insulator are possible. Recently, a class of topological insulators with strong interaction such as AmN and PuTe has been theoretically predicted. The electrical and optical devices of the present invention can be constructed using any topological materials, currently known or to be developed.

(3) Quantum Anomalous Hall (QAH) Insulators

In the present description, a Quantum Anomalous Hall (QAH) insulator is a time reversal symmetry breaking two-dimensional (2D) insulator material with insulating bulk band gap and gapless chiral edge states protected by the first Chern number. Chiral edge state refers to an edge state that carries current uni-directionally. Comparing with quantum hall insulators, a QAH insulator does not have Laudau levels, and does not need a magnetic field or only needs a small magnetic field.

In embodiments of the present invention, a QAH insulator is formed from a 2D topological insulator with time-reversal symmetry breaking, such as through the use of magnetic doping. In other embodiments, a QAH insulator is formed from a 2D trivial insulator with magnetic doping. Lastly, in some embodiments, a QAH insulator may be formed intrinsically from a 2D magnetically ordered insulator material.

The quantum versions of the Hall effect and the spin Hall effect have been discovered in recent years. The quantized anomalous Hall (QAH) effect has been theoretically predicted (see, Phys. Rev. Lett. 101, 146802 (2008); Science 329, 5987 (2010)). One way to realize a QAH insulator is through spontaneous magnetic moments and spin-orbit coupling combined to give rise to a topologically non-trivial electronic structure, leading to the quantized Hall effect without Laudau levels. Recently, based on state-of-art first principles calculations, it has been predicted that quantum anomalous Hall effect can be realized in $Hg_{1-y}Mn_yTe$ quantum wells (see, Phys. Rev. Lett. 101, 146802 (2008)) and the tetradymite semiconductors $Bi_2Te_3$, $Bi_2Se_3$, and $Sb_2Te_3$ when doped with transition metal elements (Cr or Fe) (see, Science 329, 5987 (2010)). In particular, the tetradymite semiconductors $Bi_2Te_3$, $Bi_2Se_3$, and $Sb_2Te_3$ form magnetically ordered insulators when doped with transition metal elements (Cr or Fe) (see, Science 329, 5987 (2010)), in sharp contrast to conventional dilute magnetic semiconductor where free carriers are necessary to mediate the magnetic coupling. For instance, a QAH insulator may be formed intrinsically from $GdBiTe_3$ quantum well which is a 2D magnetically ordered insulator material.

Magnetic order in two-dimensional thin films gives rise to a topological electronic structure characterized by a finite Chern number, with quantized Hall conductance $e^2/h$. Experimental realization of the long sought-after QAH insulator state could enable robust dissipationless charge transport, because of the realization of chiral edge state.

(4) Topological Magnetic Insulators

In the present description, a topological magnetic insulator is an antiferromagnetic insulator, in which the antiferromagnetic order breaks the time-reversal symmetry of a topological insulator material spontaneously and the magnetic fluctuations couple linearly to the axion field, thus realizing the dynamic axion field in condensed matter systems.

The electromagnetic response of an insulator is described by the Maxwell equations, supplemented by constitutive relations which relate the electric field E to the displacement vector D, and the magnetic induction B to the magnetic field H:

$$D=\epsilon_0 E+P-(\theta/2\pi)2\alpha B, \text{ and}$$

$$H=B/\mu_0-M+(\theta/2\pi)2\alpha E,$$

where P is the electric polarization, M is the magnetization, $\epsilon_0$ is the electric permittivity and $\mu_0$ is the magnetic permeability. The term $\alpha$ (~1/137) is the fine structure constant, and $\theta$ is an angular variable called the axion field which equals 0 mod $2\pi$ for a trivial insulator and $\pi$ mod $2\pi$ for a topological insulator. (See, Phys. Rev. B, Vol. 78, p. 195424 (2008))

The additional terms "$(\theta/2\pi)2\alpha B$" and "$(\theta/2\pi)2\alpha E$" mix electric field and magnetic field, and therefore correspond to a topological magnetoelectric effect. Unlike the electric polarization $P=\epsilon_0\chi_e E$ and the magnetization $M=\chi_m H$ described by electric $\chi_e$ and magnetic $\chi_m$ susceptibilities which depend on the details of the system, the magnetoelectric response coefficient $(\theta/2\pi)2\alpha$ is quantized to be an integer multiple of the fine structure constant $\alpha$, a universal number. The Maxwell equations together with the modified set of constitutive relations describe what is known as topological magnetoelectric effect or axion electrodynamics. (See, Phys. Rev. B, Vol. 78, p. 195424 (2008)).

The axion field $\theta$, however, is static in a time-reversal invariant trivial or topological insulator. In embodiments of the present invention, the antiferromagnetic long-range order in a trivial or topological insulator is exploited, which breaks the time-reversal symmetry of an insulator material spontaneously, so that the axion field $\theta$ becomes a dynamical axion field taking continuous values from 0 to $2\pi$. Such an antiferromagnetic insulator is referred herein as a "topological magnetic insulator," in which the antiferromagnetic order breaks the time-reversal symmetry of an insulator material spontaneously and the magnetic fluctuations couple linearly to the axion field, thus realizing the dynamic axion field in condensed matter systems.

Advantages of Topological Materials

According to embodiments of the present invention, electrical devices and optical devices for various applications are formed using the topological materials described above. In the present description, an "electrical device" refers to electrical devices operating on an electrical current, including, but not limited to, electronic devices such as transistors, resistors and integrated circuits. In the present description, an "optical device" refers to any optical device operative to emit light, to absorb light, to transport light, or to modulate light, including, but not limited to, optical devices such as laser, waveguide, optical detectors, and optical modulators. The physical properties of the topological materials described herein provide many advantages over electrical and optical devices formed using conventional materials.

First, the special helical spin texture of topological materials results in suppression of backscatter of carriers due to impurity and roughness. As a result, a topological material has a long mean free path to achieve high electron velocity, thereby realizing high speed or high frequency applications, beyond which is achievable using conventional materials.

More specifically, topological insulators belong to a class of materials with strong spin-orbital coupling. The electronic states are fully gapped inside the bulk, but time-reversal symmetry protects gapless surface states with linear energy dispersion relation. Because of the time-reversal symmetry protection, the surface states of topological insulator cannot be backscattered by any non-magnetic impurities. This together with the high Fermi velocity of the surface states lead to a long mean free path. In technologies with tens of nanometer channel length, the long mean free path characteristic means that a transistor formed using a topological insulator can operate in the ballistic limit. Analog circuits thus formed can have a cutoff frequency up to terahertz.

Furthermore, the linear energy dispersion characteristic of topological insulators also enables applications in frequency multiplication. The long mean free path leads to reduced damping of the frequency multiplied signals, which together with linear dispersion, leads to an up-conversion harmonic number greater than that achievable using conventional materials.

Lastly, topological materials also realize improved topological magnetoelectric effect. The electromagnetic response of a conventional insulator is described by the Maxwell equations, supplemented by constitutive relations which relate the electric field E to the displacement vector D, and the magnetic induction B to the magnetic field H:

$$D = \epsilon_0 E + P, \text{ and}$$

$$H = B/\mu_0 - M,$$

where P is the electric polarization, M is the magnetization, $\epsilon_0$ is the electric permittivity and $\mu_0$ is the magnetic permeability.

In a 3D topological insulator, these well-known equations acquire additional terms:

$$D = \epsilon_0 E + P - (\theta/2\pi) 2\alpha B, \text{ and}$$

$$H = B/\mu_0 - M + (\theta/2\pi) 2\alpha E,$$

where $\alpha$ (~1/137) is the fine structure constant, and $\theta$ is an angular variable called the axion field which equals 0 mod $2\pi$ for a trivial insulator and $\pi$ mod $2\pi$ for a topological insulator.

As mentioned above, the additional terms "$-(\theta/2\pi)2\alpha B$" and "$(\theta/2\pi)2\alpha E$" mix electric field and magnetic field, and therefore correspond to a topological magnetoelectric effect. Unlike the electric polarization $P=\epsilon_0\chi_e E$ and the magnetization $M=\chi_m H$ described by electric $\chi_e$ and magnetic $\chi_m$ susceptibilities which depend on the details of the system, the topological magnetoelectric response coefficient $(\theta/2\pi)2\alpha$ is quantized to be an integer multiple of the fine structure constant $\alpha$, a universal number. The Maxwell equations together with the modified set of constitutive relations describe what is known as topological magnetoelectric effect or axion electrodynamics.

Angle-resolved photoemission spectroscopy (ARPES) has established beyond any reasonable doubt that the surface of 3D TI samples such as $Bi_2Te_3$, $Bi_2Se_3$, and $Sb_2Te_3$ support metallic, gapless surface states. These surface states remain metallic even in the presence of large amounts of nonmagnetic disorder. However, magnetic impurities have been shown both theoretically and experimentally to open an energy gap in the surface states, which then become insulating. The equations of axion electrodynamics describe this case where both bulk and surface are insulating.

One striking consequence of axion electrodynamics is that such a gapped interface between a 3D topological insulator and vacuum supports a Quantum Hall (QH) state with Hall conductance $\sigma_{xy}=(n+\frac{1}{2})e_2/h$, where the integer n depends on the details of the magnetic doping profile, but the factor of $\frac{1}{2}$ is a property of the bulk 3D topological insulator state.

As mentioned above, the axion field $\theta$, however, is static in a time-reversal invariant trivial or topological insulator. However, in a topological magnetic insulator, the antiferromagnetic long-range order in a trivial or topological insulator is relied upon to breaks the time-reversal symmetry of an insulator material spontaneously, so that the axion field $\theta$ becomes a dynamical axion field taking continuous values from 0 to $2\pi$. The topological magnetic insulator, also referred to as an antiferromagnetic insulator, is realized where the antiferromagnetic order breaks the time-reversal symmetry of an insulator material spontaneously and the magnetic fluctuations couple linearly to the axion field, thus realizing the dynamic axion field in condensed matter systems.

Compared with its high-energy version, the axion realized in the topological magnetic insulator has the advantage that it can be observed in controlled experimental settings. With an externally applied magnetic field, the axion field couples linearly to light, resulting in the axionic polariton. By measuring the attenuated total reflection (ATR), the gap in the axionic polariton dispersion can be observed. In particular, an attractive feature of the topological magnetic insulator is that the axionic polariton gap is tunable by changing the external electric or magnetic fields. The control of the light transmission through the topological magnetic insulator material enables a new type of optical modulator.

Applications of Topological Materials

The topological materials described herein can be used to form various electrical and optical devices incorporating one or more layers of the topological materials. The device structure and their performance characteristics will be described in more detail below. The following description is illustrative only of the several applications in which the topological materials can be used and is not intended to be limiting. Other electrical and optical devices can be formed using one or more layers of the topological materials described herein to exploit the unique properties of topological insulators and their variants, quantum anomalous hall insulators and topological magnetic insulators.

(1) Autobahn Interconnect Device

In embodiments of the present invention, one or more layers of topological materials are used to form electrical interconnects in integrated circuits or semiconductor devices. The topological materials provide unique advantages over conventional copper interconnect technologies to enable integrated circuits to realize the performance improvement from the continue scaling of semiconductor transistors. More specifically, in embodiments of the present invention, one or more layers of topological materials are used to realize dissipationless current transport referred herein as "autobahn interconnect." In the present description, autobahn interconnect refers to current transport that is dissipationless or nearly dissipationless within the transport channel of the topological materials.

In the present description, an "an autobahn interconnect" refers to an interconnect device where the forward and backward moving charge carriers are separated on two different edges of the same transport medium, just as opposite-running traffic being separated into different lanes on a highway where traffic going in the same direction propagates in only one direction on either side of the median. In conventional interconnect materials, the charge carriers move bi-directionally along the medium—that is, the forward and backward moving charge carriers share the same transport medium at the same time. Thus, a charge carrier carrying the electrical signal can be backscattered during its propagation. Backscattering of charge carriers causes large latency and energy dissipation in conventional integrated circuits.

In an autobahn interconnect, the forward and back moving charge carriers are spatially separated on the two different edges of the interconnect device. The charge carriers propagate in one direction only on different edges of the interconnect device, just as opposite-running traffic are spatially separated into different lanes on a high way. Due to the uni-direction propagation of charge carriers within each edge channel, the charge carrier that carries signal cannot be backscattered as long as the bulk is insulating enough such that the charge carriers do not have enough energy to jump from one lane to the other. In this manner, nearly dissipationless current transport within an edge channel is realized.

In embodiments of the present invention, the autobahn interconnect includes interconnects formed using a QAH insulator layer, referred herein as a "QAH interconnect," and also axion interconnects formed using a 3D TI variant with magnetic doping, referred herein also as an "axion string" or "axion string interconnect."

FIG. 1(a) illustrates a circuit model for an autobahn interconnect device according to one embodiment of the present invention. Referring to FIG. 1(a), an autobahn interconnect device is formed by a first wire 1 connecting a signal to be transported to a load having an impedance $Z_L$. The first wire 1 can be formed using a QAH insulator layer, in the form of a QAH insulator bar. Alternately, the first wire 1 can be formed as a closed axion string loop. A resistor $R_Q$ represents the total contact resistance between the first wire 1 and a second wire 2 also connected to the load. In some embodiments, the load $Z_L$ is connected to a low resistivity ground plate 2 as the second wire. In other embodiments, the second wire 2 can also be an autobahn interconnect formed using a QAH insulator layer (a QAH insulator bar) or a closed axion string loop.

In operation, charge carriers on the first wire flow in separate edge channels where the forward and back moving charge carriers are spatially separated on the two different edge channels of the wire. Accordingly, backscattering of charge carriers is almost avoided and near dissipationless current transport is realized. When the autobahn interconnect device, such as a QAH insulator layer (a QAH insulator bar) or a closed axion string loop, is also used as the second wire in the interconnect device, charge carriers on the second wire also flow in separate edge channels where the forward and back moving charge carriers are spatially separated on the two different edge channels of the second wire.

(a) QAH Interconnect

According to Moore's law, the number of transistors in an integrated circuit doubles approximately every two years. If the trend continues, atomic length scales will be reached around 2015. Besides transistors, the copper interconnect—another major component in integrated circuits—also needs to be scaled. Scaled wires have higher resistance and capacitance, and therefore reduced bandwidth, higher delays and higher power dissipation. Such problems offset the performance benefits of transistor scaling. The hope of significant technological improvements involves addressing quantum effects directly. Recent scientific developments point to the potential usefulness of a paradigm shift in device and circuit design. Harnessing the quantum nature of matter—such as the quantum phase and spin of the electron—rather than trying to combat it offers the prospect of unprecedented device performance, well beyond that allowed by classical principles.

Integer Quantum Hall (QH) insulator discovered in 1980 was the first example of topological effect in condensed matter. It is a bulk insulator with gapless chiral edge states topologically protected by the first Chern number. These chiral edge states only move in one direction and can not be backscattered, which leads to the vanishing of resistivity and equipotential in the chiral edge channel at even a distance of 1 mm. However, the Quantum Hall effect require high magnetic field and low temperature, which limits its practical application.

Similar to Integer Quantum Hall insulator, the Quantum Anomalous Hall (QAH) insulator is also a bulk insulator with gapless chiral edge states topologically protected by the first Chern number, but does not have Landau levels as compared to the QH insulators and thus only requires zero or a small magnetic field. QAH insulators are thus suitable for practical applications.

Recently, two and three dimensional (2D and 3D) $Z_2$ topological insulators (TI) were discovered with an insulating bulk gap and gapless edge or surface states protected by time reversal symmetry (TRS). In embodiments of the present invention, a quantum anomalous hall (QAH) insulator is formed from a 2D topological insulator by breaking time reversal symmetry on the 2D topological insulator surface through magnetization, which leads to quantum anomalous hall (QAH) effect and the formation of the QAH insulator. QAH effect provides protected one dimensional gapless chiral edge states. Accordingly, QAH insulators can be used to form an autobahn interconnect device in integrated circuits to enable near dissipationless current transport in electronic devices.

Figure 1B:
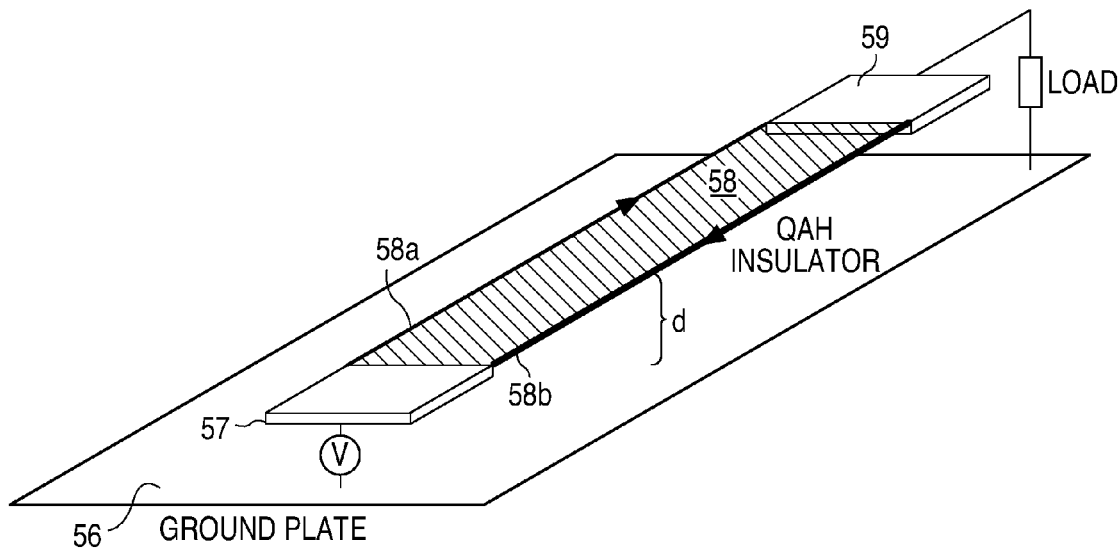
FIG. 1(b) illustrates a quantum anomalous hall autobahn interconnect device according to one embodiment of the present invention.

In embodiments of the present invention, an autobahn interconnect device is formed using a quantum anomalous hall (QAH) insulator layer. FIG. 1(b) illustrates a quantum anomalous hall (QAH) autobahn interconnect device according to one embodiment of the present invention. Referring to FIG. 1(b), an QAH insulator layer 58 is coupled between a terminal 57 receiving an input signal and a terminal 59 connected to a load. The QAH insulator layer 58 is formed as a QAH bar and is positioned a distance "d" away from a ground plate 56.

In operation, charge carriers flow in the uni-directional edge channels 58a and 58b. In the present illustration, charge carriers flow from terminal 57 (the signal) to terminal 59 (the load) along edge channel 58a. Furthermore, charge carriers flow from terminal 59 (the load) to terminal 57 (the signal) along edge channel 58b. Due to the uni-directional propagation of charge carriers within each edge channel of the QAH insulator bar 58, the charge carrier that carries signal cannot be backscattered as long as the bulk of the QAH insulator bar is insulating enough such that carriers do not have enough energy to jump from one edge channel to the other. The QAH autobahn interconnect device thus formed realizes nearly dissipationless current transport within the edge channels of the QAH insulator bar. More specifically, the QAH autobahn interconnect device thus formed is an inside-channel-dissipationless topological chiral edge state interconnect device.

The QAH autobahn interconnect device has superior performance as compared to the conventional cooper interconnect. The QAH autobahn interconnect device always operates at LC wave regime instead of RC diffusive region, leading to low latency and large bandwidth without power consumption and signal distortion during signal transmission. The QAH autobahn interconnects in principle can operate at room temperature with sufficiently large bulk band gap and in the absence of magnetic field.

In particular, the ever-degrading performance of on-chip cooper (Cu) wires threatens to greatly impede the continued integrated circuit improvement along Moore's law. All wire metrics including latency, power dissipation, bandwidth density, for local and global wires, deteriorate with scaling. Specifically, electron scattering from interfaces and grain-boundaries dramatically increases cooper resistivity as dimension scales down. Thus, there is a need for novel interconnect technologies that do not suffer the performance degradation of copper wires. According to embodiments of the present invention, QAH insulators are used to form autobahn interconnects in the form of QAH insulator bars. The autobahn interconnects thus formed operate as low latency, no power dissipation and high bandwidth interconnect for global, semi-global and local interconnects on integrated circuits.

(b) Axion String Interconnect

In embodiments of the present invention, an autobahn interconnect device is realized using closed axion string loops formed from 3D topological insulator variants with magnetic doping. A particular advantage of the axion string interconnect is that the autobahn interconnect device is readily reprogrammable.

A significant property of the 3D topological insulator— which reveals its topological nature most explicitly—is the topological magneto-electric effect (see, Phys. Rev. B 78, 195424 (2008)). More specifically, an applied magnetic field B generates an electric polarization P with a coefficient of proportionality quantized in integer multiples of the fine structure constant. Conversely, an applied electric field E generates a magnetization M with quantized coefficient. In fact, this effect is described by a new topological term which changes the standard Maxwell electrodynamics to the so-called axion electrodynamics, as described above. This novel quantization phenomenon could be detected by optical rotation experiments (see, Phys. Rev. Lett. 105, 166803 (2010)). Remarkably, the modified Maxwell electrodynamics in a 3D topological insulator—axion electrodynamics—predicts that an axion string with quantized conductance lives on the boundary of a magnetic domain wall (see, Phys. Rev. B 78, 195424 (2008)).

In embodiments of the present invention, an axion string interconnect is formed from a 3D topological insulator variant with magnetic doping. The magnetic doping breaks the time-reversal symmetry in a controlled manner to allow the 3D topological insulator variant to be applied in practical application. According to embodiments of the present invention, a reprogrammable dissipationless topological axion string interconnect device is formed using a topological insulator variant layer with magnetic doping. The magnetic doping may be a surface doping or surface and bulk doping of a topological insulator layer.

Figure 1C:
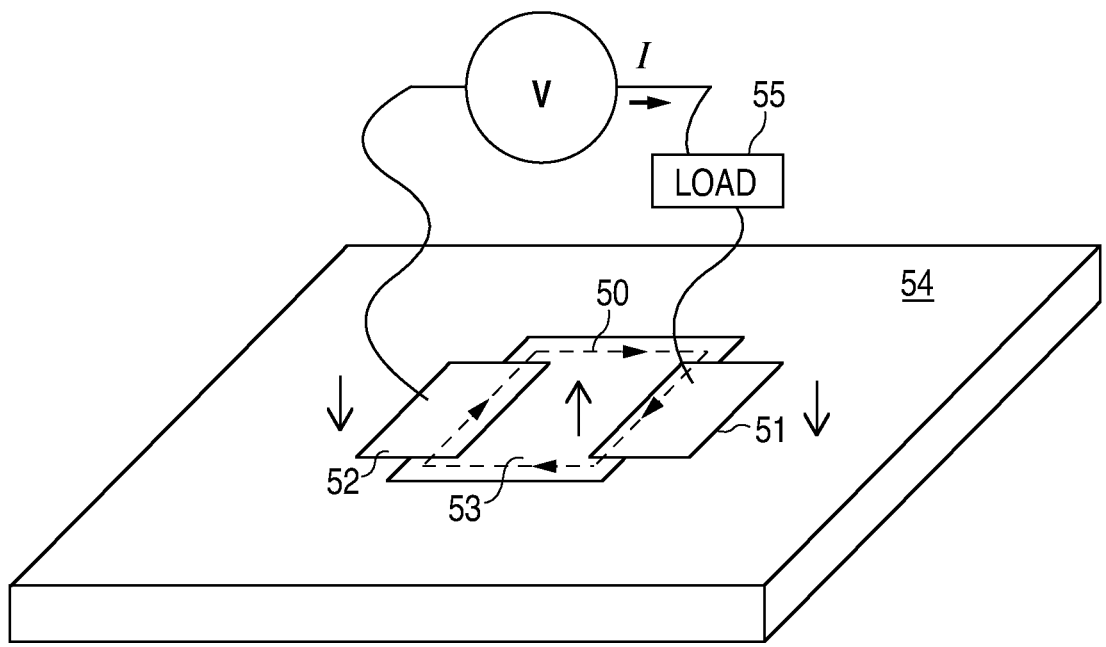
FIG. 1(c) illustrates a reprogrammable dissipationless topological axion string interconnect device according to one embodiment of the present invention.

FIG. 1(c) illustrates a reprogrammable dissipationless topological axion string interconnect device according to one embodiment of the present invention. Referring to FIG. 1(c), a dissipationless axion string interconnect device 50 is formed at the interface between two antiparallel magnetic domains on the surface of a 3D topological insulator variant layer 54 with magnetic doping. The two antiparallel magnetic domains can be formed by surface magnetic doping of a 3D topological insulator layer or magnetic doping of the surface and the bulk. When two magnetic domains are formed on at least the surface of a topological insulator layer with opposite magnetization, the boundary of the two magnetic domains will form a one dimensional (1D) axion string corresponding to a 1D chiral edge state, which supports dissipationless transport just as in the quantum Hall state. Referring to FIG. 1(c), regions 51 and 52 are two electrical contacts to measure the conductance of the topological insulator variant layer, and regions 53, 54 are doped to two opposite magnetic domains. This axion string could be a solution for the critical problem regarding interconnects in today's integrated circuits, especially for global interconnects, since the conductance due to the chiral edge state is quantized to $e^2/h = 25.8$ k$\Omega$, independent of length with sufficient large bulk band gap.

Figure 2:
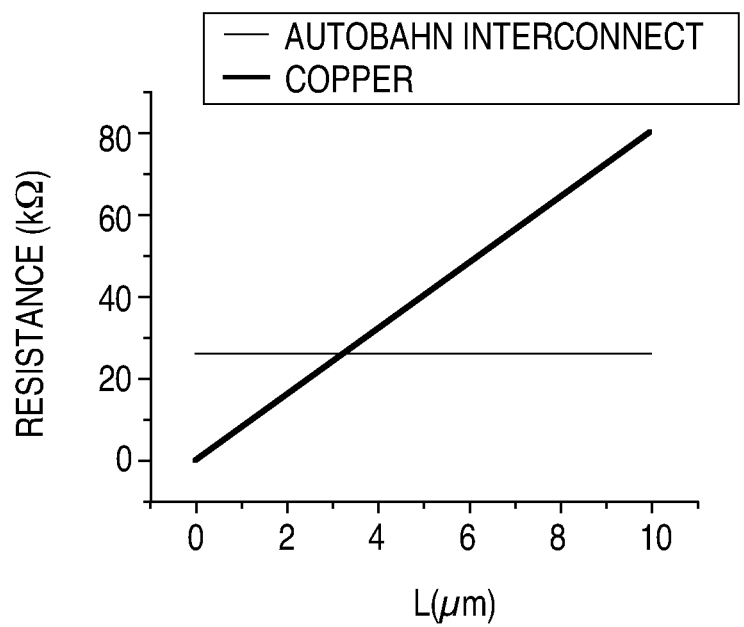
FIG. 2 is a graph comparing the resistance of the copper and autobahn interconnects.

As shown in FIG. 1(c), the inner magnetic domain (region 53) can be arbitrarily long but needs to be wide enough to avoid the hybridization of states on different sides. For a comparison of the axion string autobahn interconnect 50 with commercially used copper interconnects, both the width of the inner magnetic domain of the axion string and the copper wire (with aspect ratio 1) are assumed to be 10 nm. The resistance of the copper interconnect is $8 \times 10^3$ $\Omega \cdot$mm (see, IEEE Electron Dev. Lett. 28, 428 (2007)) times the length L. In FIG. 2, the resistance of the copper and axion string autobahn interconnect are compared. It can be seen that the axion string autobahn interconnect will surpass the performance of copper when the length exceeds 3 µm. This result is also true for quantum anomalous hall interconnect device.

Another important feature of the axion string interconnect device is that the axion string interconnect device is reprogrammable since the magnetic domain can be written or erased through an external magnetic field. That is, the axion string interconnect device can be programmed by changing the polarities of the magnetic domains. FIGS. 3(a) and 3(b) illustrate a reprogrammable architecture integrating transistors and the axion string interconnect device. FIGS. 3(a) and 3(b) illustrate the circuit and physical representations of the same circuit configuration. The cross in the circuit diagram represents connections in the programmable circuit.

In the embodiments shown in FIGS. 3(a) and 3(b), the axion string interconnect is used as a programmable dissipationless interconnect for programmable logic devices (PLD). The reprogramming process from the top circuit configuration (FIG. 3(a)) to the bottom circuit configuration (FIG. 3(b)) is illustrated as an example. As illustrated in the circuit diagrams, the logic of the circuit is determined by the position of the cross indicating the connected wires between the address (horizontal) and input (vertical) lines. In order to reprogram the circuit and change the logic, only the connection of these lines generated by the magnetic domain needs to be changed to cancel the previous connection at "ā" and to generate the connection at "a", as shown in the physical illustrations. For instance, in FIG. 3(a), an axion string interconnect line connects the node "ā" through a via in the topological insulator layer to a bottom axion string interconnect line being the address line. Another axion string interconnect line connects the node "b" through a via in the topological insulator layer to the same bottom axion string interconnect line to form the address output "ā+b". In FIG. 3(b), the programmable logic device has been reprogrammed with an axion string interconnect line connecting the "a" node through a via to the bottom address line. The address output is now "a+b". This programming process is reversible and repeatable.

(2) High Speed TI Transistor

According to embodiments of the present invention, a high speed transistor is constructed using topological insulators or topological insulator variants. A high speed transistor thus formed is referred herein as an "topological insulator (TI) transistor" but it is understood that the TI transistor may be formed using topological insulator materials or topological insulator variant materials. More specifically, the TI transistor may be formed using TI materials or TI variant materials with thickness control. In embodiments of the present invention, a TI transistor is formed using 3D topological insulator materials. In other embodiments, a TI transistor is formed using topological insulator variant materials including 2D and 3D topological insulator materials with a thickness close to the critical thickness. In yet other embodiments, a TI transistor is formed using 3D topological insulator variant materials with applied electric field.

The TI transistor thus formed may be applied to logic operation in digital applications, and to electrical signal amplification and modulation for analog applications. In digital applications, the high speed TI transistors can operate with high on-state current and low off-state current. In analog circuit applications, the high speed TI transistors can realize high cut-off frequency up to terahertz, much higher than that achievable in conventional transistor structures.

Figure 4:
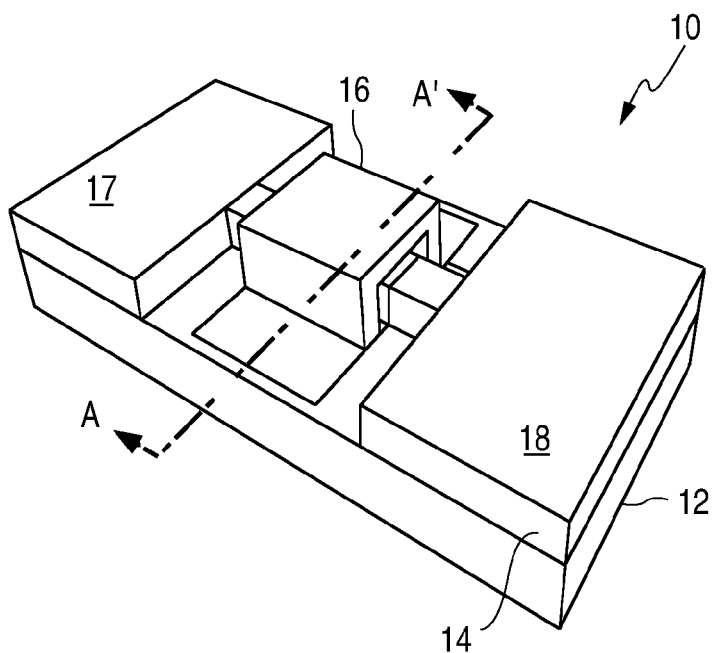
FIG. 4 is a prospective view of a topological insulator transistor according to one embodiment of the present invention.
Figure 5:
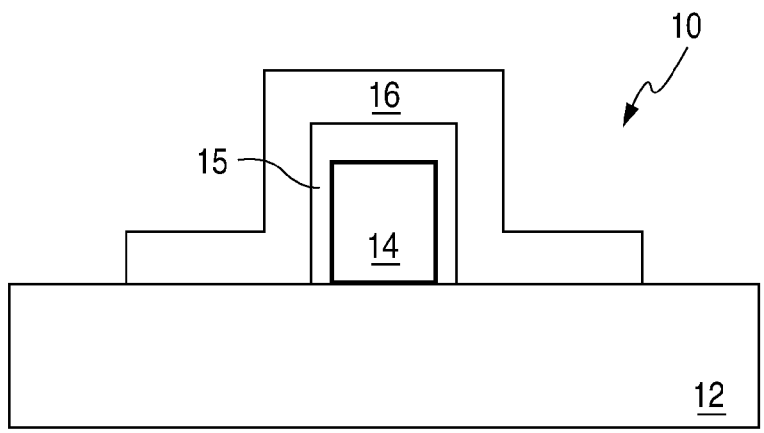
FIG. 5 is a cross-sectional view of the topological insulator transistor of FIG. 4 along the line A-A'.

In one embodiment, a topological insulator transistor is formed using the metal oxide field effect transistor (MOSFET) architecture and includes gate, source and drain terminals. A topological insulator layer or a topological insulator variant layer is used to form the channel region of the TI transistor. FIG. 4 is a prospective view of a topological insulator transistor according to one embodiment of the present invention. FIG. 5 is a cross-sectional view of the topological insulator transistor of FIG. 4 along the line A-A'. Referring to FIGS. 4 and 5, a topological insulator transistor 10 is formed on an insulating substrate 12. A layer 14 of a topological insulator material or a topological insulator variant material forms the channel. In the following description, the layer 14 is referred to as a "TI layer" or a "TI film." It is understood that layer 14 may be formed using a topological insulator layer or a topological insulator variant layer with thickness control or applied electric field. A gate dielectric layer 15 insulates the gate electrode 16 from the topological insulator layer 14. The source and drain regions 17, 18 can be doped accordingly to form source and drain electrodes, if topological insulator or semiconducting materials are used for these regions.

The topological insulator transistor 10 is semiconductor compatible and can be fabricated using well established semiconductor fabrication processing technologies. The topological insulator transistor 10 can also be readily integrated to form an integrated circuit. In one embodiment, the layer 14 of a topological insulator or its variant is grown by molecular beam epitaxy (MBE) on a single crystalline silicon substrate. Topological insulator transistors have advantages over graphene or III-V compound devices due to the ease of fabrication and integration.

In another embodiment, a topological insulator transistor can be formed using a double gate architecture including a top gate and a bottom gate. For instance, the bottom gate is formed on the back side of substrate 12 in the transistor 10 of FIG. 4. In other embodiments, a topological insulator transistor can be formed using a top gate only or using a bottom gate only.

In the embodiment shown in FIG. 4, the gate electrode of the high speed topological insulator transistor is a three-dimensional gate structure wrapping around the top and two sides of the topological insulator (or variant) layer forming the channel region. In other embodiments, the gate electrode can be formed as a planar structure. That is, the gate electrode is formed only on the top side of the channel region between the source and drain. Other geometry for the gate structure can also be used in other embodiments of the present inventions.

Figure 8:
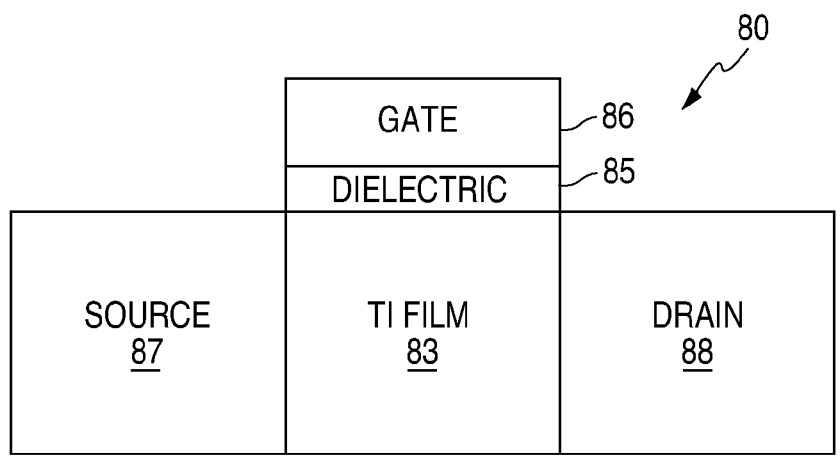
FIG. 8 is a cross-sectional view of a high speed topological insulator transistor in a planar geometry according to one embodiment of the present invention.

FIG. 8 is a cross-sectional view of TI-based coherent ultra-high speed transistor in a planar geometry according to one embodiment of the present invention. Referring to FIG. 8, a TI transistor 80 is formed on a substrate (not shown). A layer 83 of a topological insulator material or a topological insulator variant material forms the channel region of the transistor. In the following description, the layer 83 is referred to as a "TI layer" or a "TI film." It is understood that layer 83 may be formed using a topological insulator layer or a topological insulator variant layer with thickness control or applied electric field. The source region 87 and the drain region 88 of the transistor can be formed of the same TI film or other suitable materials. A gate dielectric layer 85 insulates the gate electrode 86 from the TI film 83 forming the channel region. The source and drain regions 87, 88 can be doped to form source and drain electrodes, if topological insulator or semiconducting materials are used for these regions.

(a) TI Transistor Using 3D TI Surface States and 3D TI Variants

In embodiments of the present invention, a topological insulator transistor is formed uses a 3D topological insulator layer in the channel region, such as layer 14 in transistor 10 (FIG. 4) or layer 83 in transistor 80 (FIG. 8). The surface states of the 3D topological insulator layer provides for the current transport in the channel. Because the surface states of the topological insulator have very high Fermi velocity and time-reversal symmetry topological protection for back scattering, a long mean free path in the channel is realized. When the channel length is on the order of tens of nanometer, the topological insulator surface states can easily reach ballistic transport. A topological insulator transistor thus formed can operate in the ballistic limit, that is, in the terahertz range. Furthermore, the electronic velocity is insensitive to temperature as compared to conventional transistor devices.

When topological insulator transistors are applied in analog applications, the topological insulator transistors can be used to form a signal amplifier or a modulator by modulating the channel electron density through gating. Furthermore, the electrons of surface or edge states of a topological insulator layer move at the high speed of Fermi velocity in the channel. Thus, the topological insulator transistor can operate at very high cut-off frequency up to terahertz. A cut-off frequency in the terahertz range is about 3 times larger than conventional fastest high electron mobility transistor (HEMT) made of III-V compounds.

Figure 7A:
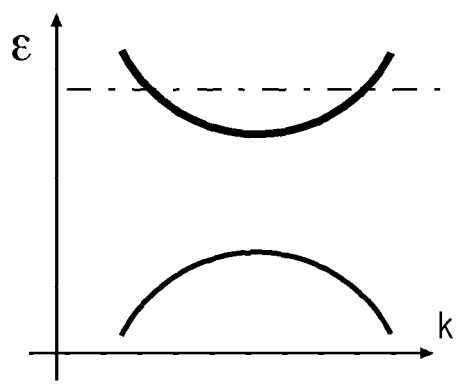
FIGS. 7(a) to 7(c) illustrate thickness or pressure induced topological phase transition for a 2D topological insulator material.
Figure 7B:
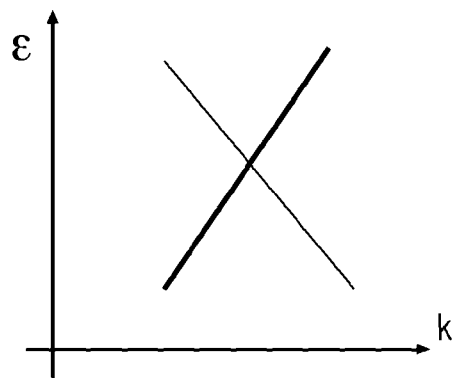

According to embodiments of the present invention, a TI transistor may be formed using a 3D TI variant layer with applied electric field. Such a topological insulator transistor is particularly useful in digital applications. More specifically, the channel of the TI transistor is formed using a 3D topological insulator variant layer with applied electric field. The 3D topological insulator variant layer may have a thickness in the range of tens of nanometer. As thus configured, an applied gate voltage causes the surface states of the 3D topological insulator layer on the top and the bottom surfaces of the channel to hybridize by opening up an energy gap, thus reach- Assume that pressure is applied on the out-of-plain direction, the strain and stress to form the quantum critical thickness illustrated in FIG. 7(b) is shown in Table 1 below. Table 1 depicts pressure-induced topological transitions for $Bi_2Te_3$ and $Bi_2Se_3$ thin films. Negative and positive values of strain indicate compressive and tensile strain, respectively. "NO" indicates that no topological transition takes place for the given nominal thickness and "QL" stands for quintuple layer.

TABLE 1

|  | $E_g$ before stress | Strain | Stress (GPa) | Topological Transition | $V_F$ of 2D Dirac cone (cm/s) |
|---|---|---|---|---|---|
| $Bi_2Te_3$ 2 QL | 14 | −0.28% | 0.06 | Trival→Non-trivial | $3.2 \times 10^7$ |
| $Bi_2Te_3$ 3 QL | 26 | −1.4% | 0.69 | Non-trivial→Trival | $2.7 \times 10^7$ |
| $Bi_2Te_3$ 4 QL | 14 | −5% | 2.3 | Trival→Non-trivial | $1.7 \times 10^7$ |
| $Bi_2Se_3$ 2 QL | 400 |  |  | No |  |
| $Bi_2Se_3$ 3 QL | 270 | −8% | 2.7 | Trival→Non-trivial | $2.3 \times 10^7$ |
| $Bi_2Se_3$ 4 QL | 97 | −5.3% | 2.3 | Trival→Non-trivial | $2.3 \times 10^7$ |
| $Sb_2Te_3$ 2 QL | 310 |  |  | No |  |
| $Sb_2Te_3$ 3 QL | 73 | −2.8% | 1.72 | Trival→Non-trivial | $3.2 \times 10^7$ |
| $Sb_2Te_3$ 4 QL | 20 | −1.0% | 0.85 | Trival→Non-trivial | $3.4 \times 10^7$ | ing the digital off-state. The off-state current is greatly reduced through hybridization between the top and the bottom surfaces of the topological insulator channel when the chemical potential of the channel lies in the gap during the off-state. Because of the ballistic transport feature, the on-state current is high. These two factors together give a high on/off ratio for a topological insulator transistor in digital applications.

According to embodiments of the present invention, a topological insulator transistor is formed uses a 3D topological insulator layer or a 3D TI variant layer as the channel layer, such as transistor 10 (FIG. 4) or transistor 80 (FIG. 8). The gate dielectric layer such as layer 15 in transistor 10 (FIG. 4) or layer 85 in transistor 80 has a thickness much smaller than a wavelength of a radiation signal to be generated and the topological insulator transistor has a channel length smaller than a mean free path caused by impurity and phonon scattering but larger than the average distance between electrons.

In other embodiments, a constant voltage is applied to the gate electrode and the source electrode of the topological insulator transistor and a constant current is applied to the source and drain electrodes of the transistor, a plasma is generated in the channel region of the transistor, the plasma emitting radiation.

Figure 7C:
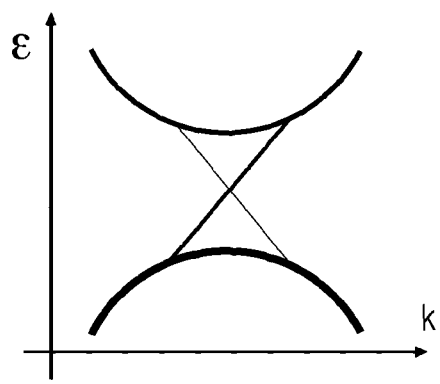

According to embodiments of the present invention, mechanical pressure is applied on the 3D topological insulator variant layer to modulate the layer thickness and induce a crossover of the conduction and valence band. As discussed above, when the thickness of the 3D topological insulator is small enough, such as less than tens of nanometer, the surface states of the topological insulator layer becomes gapped or have non-zero energy band gap. Furthermore, when mechanical pressure is applied on the topological insulator film, the film thickness changes. This induces a crossover of the conduction and valence band, accompanied by a closing and re-opening of the band gap, as shown in FIG. 7(a)-(c). During this crossover, the thin film undergoes a transition from topologically trivial insulator, as shown in FIG. 7(a)), to topologically nontrivial (QSH insulator), as shown in FIG. 7(c), or vice versa. In particular, the intermediate stage between these two insulating states is illustrated in FIG. 7(b) where the energy bands form a single Dirac cone, similar to the HgTe quantum well case.

In some embodiments, a topological insulator (TI) transistor is formed using a 3D topological insulator variant layer with reduced thickness in the channel region so that the surface states becomes gapped. Then, mechanical pressure is applied on the 3D topological insulator variant layer to modulate the layer thickness and induce a crossover of the conduction and valence band.

(b) TI Transistor Using 2D TI Layer Close to Critical Thickness

According to embodiments of the present invention, an ultra-high speed topological insulator (TI) transistor is formed using a 2D topological insulator layer or 2D topological insulator variant layer having a thickness close to the critical thickness in the channel region. A 2D topological insulator layer (or variant) with a thickness close to the critical thickness becomes gapless or close to gapless so that the 2D TI layer (or variant) becomes a conducting layer. A salient feature of the ultra-high speed TI transistor is that the transistor can achieve high operating speed at room temperature.

The 2D topological insulator layer has the 2D Dirac fermions of the quantum spin hall (QSH) insulator at a thickness close to the critical thickness. The 2D topological insulator, also denoted quantum spin Hall (QSH) state, was predicted to exist in type-III HgTe/CdTe quantum wells by Bernevig, Hughes, and Zhang in 2006 (see, Science 314, 1757 (2006)), and was observed by König and co-workers in 2007 (see, Science 318, 766 (2007)).

Figure 6:
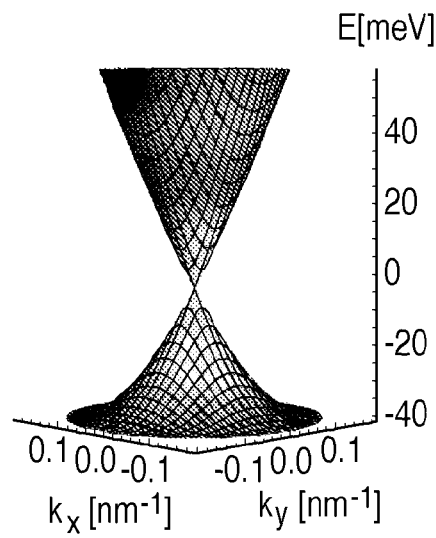
FIG. 6 illustrates a Dirac spectrum of a HgTe quantum well at the critical thickness.

The 2D HgTe system exhibits a topological quantum phase transition at a critical quantum well thickness $d_c$, below which the system is a topologically trivial insulator (FIG. 7(a)), and above which the system is a QSH insulator (FIG. 7(c)) (see, Science 314, 1757 (2006)). On either side of the transition, the bulk is fully gapped. However, precisely at the critical point $d=d_c$, the system becomes gapless in the bulk, and the spectrum corresponds to a 2D massless Dirac fermion, as shown in FIG. 6 and FIG. 7(b), and is similar to the surface states of the 3D topological insulator layers and to graphene. The difference between these three systems consists in the number of gapless Dirac cones: 4 for graphene (two spins and two valleys), 2 for HgTe at the critical point (two spins and one valley), and 1 for the surface state of the 3D TIs such as $Bi_2Se_3$ or $Bi_2Te_3$ (see, Nature Physics 5, 438 (2009)). HgTe samples at the critical point have been experimentally realized (see, arXiv:1009.2248 (2010)), for a quantum well thickness d=6.3 nm at a temperature of 4K. For a different temperature, this critical thickness could change.

The topological insulator transistor may be formed using the transistor architecture of FIGS. 4 and 5 and FIG. 8. In embodiments of the present invention, the TI layer or TI film 14 or 83 forming the channel region of the TI transistor 10 or 80 is a two-dimensional (2D) topological insulator layer having a thickness close to the critical thickness such that the topological insulator layer becomes close to gapless or has a small gap in the bulk. That is, at the critical thickness, the 2D TI film becomes a conducting layer even under low temperature and undoped. As thus configured, the TI transistor 10 or 80 has a channel region constructed based on the 2D Dirac fermions of the QSH insulator close to the critical thickness. In some embodiments, 2D TI film close to the critical thickness forming the channel region include HgTe quantum wells or other 2D TI materials, such as $Bi_2Te_3$, $Bi_2Se_3$, $Sb_2Te_3$ thin film. The carrier density in the transistor channel is modulated by a gate potential, which affects the current flow from the source to the drain.

(c) Advantages of TI Transistors

There have been a number of recent proposals to use graphene as channel material for high speed transistors (see, Science 327, 662 (2010)). Such proposals are predicated on the unique "relativistic" Dirac nature of charge carriers in graphene as compared to the nonrelativistic carrier dynamics in conventional semiconductor 2D electron gases (2DEGs) such as Si, InGaAs, or InP. In the ballistic limit L< or ~λ, where L is the channel length and λ is the mean free path transport in nanometer-size transistors and λ is usually above tens of nanometers, the velocity of carriers in conventional 2DEGs (two-dimensional electron gas) is bounded by the thermal velocity $v_{th}=\sqrt{k_B T/m}$, with $k_B$ being the Boltzmann constant, T being the temperature, and m being the effective mass. Meanwhile, in Dirac materials, carriers propagate with a very high Fermi velocity $v_F$.

Table 2 below compares the velocity v for ballistic transport and cutoff frequency $f_T$ estimated as $f_T = v/2\pi L$ for both conventional materials and for HgTe 2D TI materials. In Table 2, L is equal to 15 nm, which is comparable to the mean free path λ of silicon and thus all materials are in the ballistic limit. From Table 2, it can be observed that transistors made from HgTe TI materials have the highest coherent velocity, and therefore the highest cutoff frequency.

TABLE 2

| | Si | InGaAs/InP | HgTe QW |
|---|---|---|---|
| Maximum velocity ($10^7$ cm/s) | 1 | 4.3/2.4 | 6 |
| Cutoff frequency (THz) | 1.1 | 4.6/2.6 | 6.4 |

In the diffusive limit L>>λ, where L is the channel length and λ is the mean free path, the relevant quantity is the mobility μ, which relates the drift velocity v to the electric field E by v=μE. In this case, the room-temperature mobility of HgTe far exceeds that of graphene transistors, as shown in Table 2 below. Accordingly, the 2D TI transistor can operator faster than other materials at the same electrical field along the channel.

TABLE 3

| T = 300 K | Si | InGaAs | graphene | HgTe QW |
|---|---|---|---|---|
| mobility μ ($cm^2/V \cdot s$) | 200 | 1,014 | 1,500 | 50,000 |

With the recent advances in materials processing techniques, it is expected that mobilities as high as 50,000 $cm^2/V \cdot s$ can be reached in HgTe quantum wells. This is due to advanced growth techniques such as molecular beam epitaxy (MBE) which allow a significant degree of control over defects and impurities, as compared to the less reliable methods used in the preparation of graphene samples. This paves the way for tremendous progress in exploiting unique carrier dynamics in TI materials, under even under realistic conditions such as room temperature.

One possible reason of the extremely high mobility of HgTe as compared to that of graphene is the energy spectrum difference of charge carriers in both materials. In graphene, the low-energy spectrum, is well described by two spin-degenerate Dirac cones at two inequivalent valleys in the Brillouin zone, giving rise to four massless Dirac cones in total. Because of the presence of two valleys, graphene could suffer from inter-valley scattering, which degrades the mobility of the graphene transistor. By contrast, in HgTe quantum wells, there is only a single Dirac cone valley and no inter-valley scattering can happen. The same is also true for other 2D TIs close to critical thickness with a single Dirac cone.

(3) Frequency Multiplier

According to embodiments of the present invention, a topological insulator (TI) frequency multiplier is constructed for generation of high frequency electrical signals. The frequency multiplier thus formed is referred herein as a "topological insulator (TI) frequency multiplier" but it is understood that the TI frequency multiplier may be formed using topological insulator materials or topological insulator variant materials. More specifically, the TI frequency multiplier may be formed using TI materials or TI variant materials with a 2D Dirac fermion. In embodiments of the present invention, a TI frequency multiplier is formed using 3D topological insulator materials. In other embodiments, a TI frequency multiplier is formed using topological insulator variant materials including 2D and 3D topological insulator materials with a thickness close to the critical thickness. In operation, the TI frequency multiplier uses the conducting surface states of the topological insulator layer or its variant layer for current transport. Due to the linear energy dispersion property of the topological insulator material and its variants, the frequency multiplier operates with high power conversion efficiency.

Figure 9:
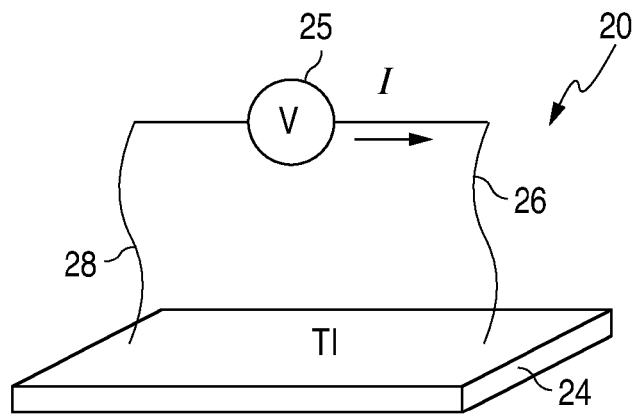
FIG. 9 is a prospective view of a TI frequency multiplier according to one embodiment of the present invention.

FIG. 9 is a prospective view of a TI frequency multiplier according to one embodiment of the present invention. Referring to FIG. 9, a TI frequency multiplier 20 is a two terminal device formed using a layer 24 of a topological insulator or a topological insulator variant material. The layer 24, referred herein as a topological insulator layer, may be formed using a 3D TI layer, a 2D or 3D TI layer with a thickness close to the critical thickness. The TI frequency multiplier is constructed by connecting two spaced-apart electrodes 26, 28 to the surface of the topological insulator layer 24. The TI frequency multiplier 20 functions like a resistor but with frequency multiplication. That is, application of an input AC signal will generate in the TI frequency multiplier an output AC signal having a higher order frequency.

More specifically, when a large AC signal (voltage source 25) with a frequency f is applied between the two electrodes 26, 28, response currents (I) having frequencies (m*f) that are odd Fourier harmonics of the input frequency f, m=1, 3, 5, . . . , will be generated. The response currents decrease very slowly with increasing harmonic numbers. In this manner, by application of an AC voltage signal, an AC current of higher order frequency is generated. The TI frequency multiplier 20 can be used as sources of high frequency electrical signals up to the terahertz range.

Furthermore, the TI frequency multiplier realizes other advantages over conventional frequency multipliers. Because the topological insulator or variant surface states have long electron mean free path, the TI frequency multiplier had less damping of the generated current signals, which together with the unique linear dispersion leads to high power conversion efficiency. Conventional non-cascading Schottky diode frequency multipliers using thermionic emission can only work with up-conversion harmonic number (m) that equals to 2 or 3, because of the low power conversion efficiency for higher up-conversion harmonic numbers. To the contrary, the TI frequency multiplier of the present invention generates the response currents with different harmonic numbers that fall very slowly with the harmonic number. Thus, a non-cascading topological insulator frequency multiplier in accordance with the present invention can operate at an up-conversion harmonic number (m) greater than 3.

The TI frequency multiplier is compatible with semiconductor and thus can be readily fabricated and integrated using well established semiconductor fabrication processing technologies. For instance, in one embodiment, the topological insulator layer or variant is grown by molecular beam epitaxy (MBE) on a single crystalline silicon substrate. The TI frequency multiplier has advantages over conventional frequency multipliers such as those formed using graphene for its ease of fabrication and ease of integration.

(4) Photodetection

According to embodiments of the present invention, a topological insulator (TI) photodetector is constructed for wide bandwidth, high performance photo-detection covering a broad spectrum ranging from terahertz to infrared. The photodetector thus formed is referred herein as a "topological insulator (TI) photodetector" but it is understood that the TI photodetector may be formed using topological insulator materials or topological insulator variant materials. More specifically, the TI photodetector may be formed using TI materials or TI variant materials with thickness control. In embodiments of the present invention, a TI photodetector is formed using 3D topological insulator materials. In other embodiments, a TI photodetector is formed using topological insulator variant materials including 2D and 3D topological insulator materials with thickness control.

Figure 10:
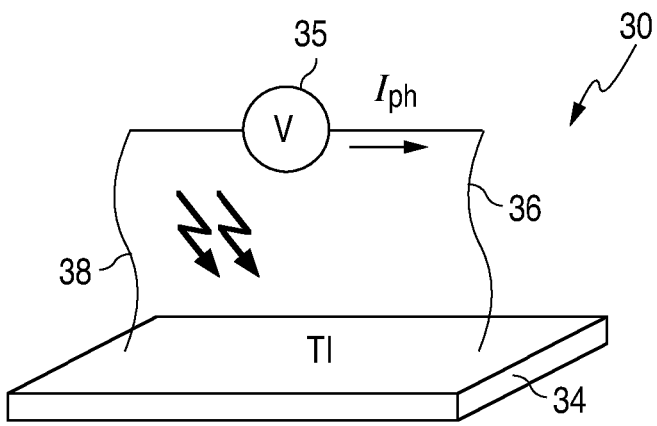
FIG. 10 is a prospective view of a TI photodetector according to one embodiment of the present invention.

FIG. 10 is a prospective view of a TI photodetector according to one embodiment of the present invention. Referring to FIG. 10, a TI photodetector 30 is formed using a layer 34 of a topological insulator material or a topological insulator variant material in the form of a resistor. The layer 34, referred herein as a topological insulator layer, may be formed using a 3D TI layer, or a 2D or 3D TI variant layer with thickness control. Two conductive electrodes 36, 38 are formed on and in electrical contact with the topological insulator layer 34. An optional voltage source 35 may be used to apply a voltage between the conductive electrodes 36, 38. Conductive electrodes 36, 38 carries a current flowing in the surface states of the topological insulator layer where the current is generated as a result of optical absorption. More specifically, incident light impinging on the topological insulator layer 34 causes electron-hole pairs to be generated in the surface states of the topological insulator layer. As a result, a current $I_{ph}$ flows between the two conductive electrodes 36, 38. The current flows through the two conductive electrodes, or a voltage indicative of the current, can be measured to determine the amount of light absorption.

In embodiments of the present invention, a topological insulator variant layer may be used with different thicknesses to modulate the surface energy band gap of the topological insulator variant layer. Alternately, the topological insulator variant layer may be subjected to an applied electrical field to modulator the surface energy band gap of the topological insulator variant layer. Furthermore, when the topological insulator variant layer has varied thickness, the surface of the topological insulator variant layer becomes a gaped energy band semiconductor layer and the surface energy band gap is further modulated by an applied electrical field to enable control over the light detection operation of the topological insulator layer, such as to turn light detection on or off.

In one embodiment, a controllable surface energy band gap is generated by thinning down the topological insulator layer to below tens of nanometer. Alternately, dynamic control of the surface energy band gap can be realized through an applied electrical field. Dynamic control over the light detection by an applied electrical field allows a TI photodetector to be applied in a wide range of photonic applications such as high speed optical communications and imaging.

Figure 11:
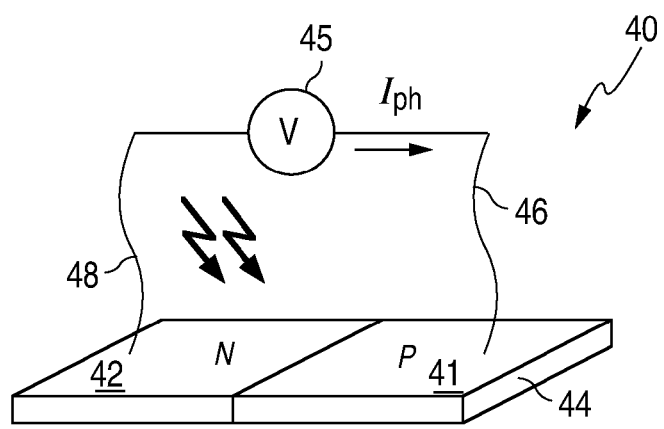
FIG. 11 is a prospective view of a TI photodetector according to an alternate embodiment of the present invention.

In another embodiment, a TI photodetector is formed using a doped topological insulator (or variant) layer in the form of a p-n junction. Different regions of a topological insulator (or variant) layer are doped to n-type and p-type to form the p-n junction for photodetection, as shown in FIG. 11.

In sum, TI photodetectors are constructed to exploit the optical absorption properties of topological insulators. TI photodetectors can be used in a wide range of photonic applications including thermal detection, high-speed optical communications, interconnects, terahertz detection, imaging, remote sensing, surveillance and spectroscopy.

In addition to photodetection, the topological materials described herein may also be used for other optoelectronic devices, such as terahertz laser, waveguide, plasmon based radiation generation and detection and transparent electrode. In one embodiment, a layer of a topological material is used to form a transparent electrode. In another embodiment, a layer of a topological material is used to form a gain layer of a laser.

(5) Axion Modulator and Sensor

The dynamic axion field $\theta$ couples nonlinearly to the external electromagnetic field combination $E \cdot B$. When there is an externally applied static and uniform magnetic field $B_0$ parallel to the electric field E of the photon, the axion field $\theta$ will couple linearly to E. In condensed-matter systems, when a collective mode is coupled linearly to photons, hybridized propagating modes called polaritons emerge. The polaritons can be coupled modes of optical phonons and light through the electric dipole interaction, or coupled modes of magnons and light through the magnetic dipole interaction.

Figure 12:
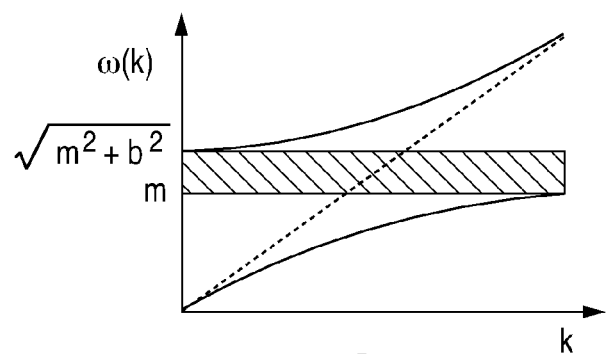
FIG. 12 illustrates the dispersion spectrum of the axionic polariton.

According to embodiments of the present invention, a novel type of polariton, referred to as the "axionic polariton," is constructed. The axionic polariton is the coupled mode of light and the axionic mode of an topological magnetic insulator. FIG. 12 illustrates the dispersion spectrum of the axionic polariton. Referring to FIG. 12, the dispersion spectrum of the axionic polariton consists of two branches separated by a gap between m and $\sqrt{m^2+b^2}$. The quantity b measures the coupling strength between the axion field and the electric field and is proportional to the external magnetic field $B_0$. When magnetic field $B_0$ is turned on, the axionic mode at wave vector k=0 changes its frequency from m to $\sqrt{m^2+b^2}$, nowing to the linear mixing between the axion and the photon field. Physically, the axionic polariton is very similar to the transverse optical phonon polariton, because the axion also leads to an extra contribution to the charge polarization owing to the topological magneto-electric effect. The optical phonon polariton has the same dispersion as the axionic polariton, with the parameter b replaced by the lattice unscreened plasmon frequency $\omega_p = \sqrt{4\pi n e^2/m^*}$, where n is the number density of electrons, e is the electric charge, m* is the effective mass of the electron. The key difference between the axion and the optical phonon is that the coupling between the axion and the electric field is determined by the external magnetic field $B_0$, which is thus tunable.

Figure 13A:
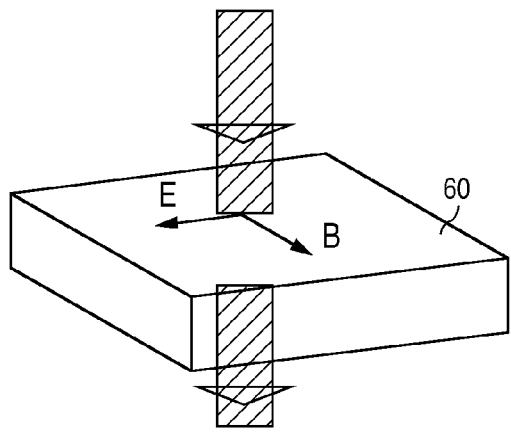
FIGS. 13(*a*) and 13(*b*) illustrate the attenuated total reflection (ATR) realized in a topological magnetic insulator layer due to the gap in the axionic polariton spectrum.
Figure 13B:
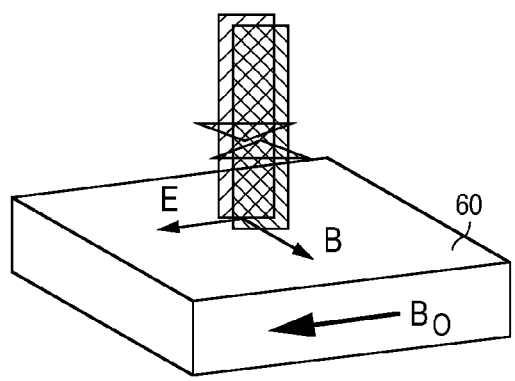

In FIG. 12, the shaded area indicates the forbidden band between frequencies m and $\sqrt{m^2+b^2}$, within which light cannot propagate in the topological magnetic insulator layer. The dotted line illustrates the bare photon dispersion $\omega = c'k$. The gap in the axionic polariton spectrum may be observed using the attenuated total reflection (ATR) method, as shown in FIGS. 13(a) and 13(b). In the ATR method, the geometry is arranged such that the incident light is perpendicular to the surface of a topological magnetic insulator layer 60 and a static magnetic field is applied in parallel to the electric field of the light. As shown in FIG. 13(a), when no external magnetic field is applied, the incident light can transmit through the topological magnetic insulator layer 60. However, when an external magnetic field $B_0$ is applied parallel to the electric field of the light, the incident light will be totally reflected if its frequency lies within the forbidden band, as shown in FIG. 13(b). More specifically, as the light can propagate through the media only in the form of the axionic polariton, when the frequency of the incident light is within the gap of the axionic polariton spectrum (the shaded area in FIG. 12), a significant increase of the reflectivity results and the light becomes reflected rather than transmitting through the topological magnetic layer 60.

The gap can be estimated using parameters obtained for $Bi_2Se_3$. A typical exchange splitting for an antiferromagnet $m_5$ is 1 meV, and an estimated dielectric constant $\in$ is 100. With a magnetic field $B_0=2T$, the axion mass m=2 meV and b=0.5 meV are obtained. The gap is $\sqrt{m^2+b^2}-m=0.07$ meV, which can be observed experimentally. One unique signature of the axionic polariton is the dependence of the gap on $B_0$, which can be used to distinguish from usual magnetic polaritons. By changing the magnitude of $B_0$, the frequency band within which the light is totally reflected can be selected. Accordingly, an amplitude optical modulator operating at the far-infrared frequency can be constructed using the topological magnetic insulator described herein with an externally applied magnetic field.

In embodiments of the present invention, the topological magnetic insulator can also be used as a sensor to sense magnetic field.

(6) Magnetic Monopole Memory

According to embodiments of the present invention, a monopole memory device is formed using a layer of topological material. In one embodiment, the monopole memory device is formed using a layer of topological insulator variant with magnetic doping.

FIG. 14 illustrates the image electric charge and monopole of a point-like electric charge in a topological insulator variant layer according to embodiments of the present invention. The insert FIG. 14(a) illustrates the top view of the topological insulator variant layer and the in-plane components of the electric field and surface current. Referring to FIG. 14, a layer 70 of a topological insulator variant with magnetic doping is placed in the lower-half space (z<0) of the coordinate plane. The topological insulator variant layer 70 has a dielectric constant $\in_2$ and a magnetic permeability $\mu_2$. A layer 72 of a conventional material is formed above the topological insulator variant layer 70 in the upper-half space (z>0). The layer 72 has a dielectric constant $\in_1$ and a magnetic permeability $\mu_1$. In some embodiments, the layer 72 may be omitted and the upper half space is a vacuum. In the following description, the term "layer 72" refers to a conventional material or vacuum.

In FIG. 14, a point electric charge q is located at (0, 0, d) with d>0. The thin solid lines represent the electric field lines, while the thicker solid lines represent magnetic field lines. In FIG. 14(a), the in-plane component of the electric field at the surface is illustrated in solid lines while the circulating surface current is illustrated by the dashed lines.

With the axion electrodynamics of the topological magnetic insulator and the standard boundary conditions, the following results are obtained. When observed from the lower-half space towards layer 72, the electric field is given by an effective point charge $q/\in_1$ and an image electric charge $q_1$ at location (0, 0, d), whereas the magnetic field is given by an image magnetic monopole g1 at location (0, 0, d). When observed from the upper-half space towards topological insulator variant layer 70, the electric field is given by $q/\in_1$ at (0, 0, d) and an image electric charge $q_2$ at (0, 0, -d), whereas the magnetic field is given by an image magnetic monopole $g_2$ at (0, 0, -d).

The above expressions show that, for an electric charge near the surface of a topological insulator layer, both an image magnetic monopole and an image electric charge will be induced, as compared with conventional electromagnetic media where only an electric image charge will be induced.

The physical origin of the image magnetic monopole is understood by the surface Hall current density, which is induced by the in-plane component of the electric field and is perpendicular to this component. This current is the quantized Hall current described above, which is circulating around the origin, as shown in FIG. 14(a). Physically, this surface current is the source that induces the magnetic field. On each side of the surface, the magnetic field induced by the surface current can be viewed as the field induced by an image magnetic monopole on the opposite side.

Accordingly, the image magnetic monopole field indeed has the correct magnetic field dependence expected from a monopole, and the image magnetic monopole field can be controlled completely through the position of the electric charge. In embodiments of the present invention, a magnetic memory device is formed using a topological insulator variant layer with magnetic doping and a magnetic memory layer formed thereon, as shown in FIG. 15. More specifically, the magnetic memory device includes a layer 74 of a topological insulator variant with magnetic doping and a magnetic memory device layer 76 formed adjacent the layer 74. The magnetic memory layer may be a magnetoresistive random access memory (MRAM) or a conventional hard disk memory. The magnetic memory device can generate a magnetic field in the magnetic memory device layer 76 through an imaging magnetic monopole $g_2$ of the charge q. Accordingly, the magnetic memory device layer 76 can be written using an electric charge instead of an electric current in today's conventional magnetoresistive random access memory (MRAM). Programming or writing a magnetic memory device using an electric charge can be much more energy efficient and make magnetic memories more scalable.

The above-described electrical and optical devices are illustrative only and are not intended to be limiting. One of ordinary skill in the art, upon being apprised of the present description, would appreciate that many other electrical and optical devices can be formed using the topological materials described herein to exploit the unique properties of the topological materials.

The above detailed descriptions are provided to illustrate specific embodiments of the present invention and are not intended to be limiting. Numerous modifications and variations within the scope of the present invention are possible. The present invention is defined by the appended claims.

We claim:

1. An electrical device, comprising:
an integrated circuit comprising a current transport layer formed using a layer of a topological insulator material, wherein the topological insulator material has an insulating energy band gap in the bulk and conducting edge or surface states,
the layer of topological insulator material having a width of at least 10nm;
a first electrode formed on the integrated circuit and in electrical contact with the current transport layer at a first location;
a second electrode formed on the integrated circuit and in electrical contact with the current transport layer at a second location;
a first circuit connected to a first electrode; and
a second circuit connected to the second electrode,
the first circuit, the second circuit, the first electrode, the second electrode, and the layer of topological insulator material being configured to carry current in either direction between the first circuit and the second circuit,
wherein the layer of the topological insulator material contains magnetic doping, and
wherein the topological insulator material is selected from the group of: (1) HgTe; (2) a compound comprising at least two of Bi, Sb, Te, and Se; (3) a ternary Heusler compound; (4) AmN; and (5) PuTe.

2. The electrical device of claim 1, wherein the layer of topological material comprises a two-dimensional (2D) or three-dimensional (3D) topological insulator layer with an insulating energy band gap in the bulk and conducting edge or surface states, respectively, protected by time-reversal symmetry.

3. The electrical device of claim 2, wherein the layer of topological material comprises a two-dimensional (2D) or three-dimensional (3D) topological insulator variant layer, the topological insulator variant layer being formed from a 2D or 3D topological insulator layer by thickness control, by magnetic doping, or by applying an electrical potential to the topological insulator layer.

4. The electrical device of claim 3, wherein the 2D topological insulator variant layer is formed by varying the thickness of a 2D topological insulator layer, wherein when the thickness of the 2D topological insulator layer is varied, the 2D topological insulator variant layer becomes a topological insulator or a trivial insulator.

5. The electrical device of claim 3, wherein the 2D topological insulator variant layer is formed from a 2D topological insulator layer having a thickness close to a critical thickness, the 2D topological insulator variant layer becoming a conductor layer.

6. The electrical device of claim 3, wherein the 3D topological insulator variant layer is formed by varying the thickness of a 3D topological insulator layer, wherein when the thickness of the 3D topological insulator layer is reduced, the surface states of the topological insulator layer become gapped or have an appreciable energy band gap and the 3D topological insulator variant layer becomes a 2D insulator.

7. The electrical device of claim 6, wherein the layer of topological material comprises a 3D topological insulator variant layer having a reduced thickness and being subjected to an electrical potential, wherein the surface states of the 3D topological insulator variant layer become a topological insulator or a trivial insulator having a gapped energy band gap or appreciable energy band gap.

8. The electrical device of claim 3, wherein the topological insulator variant layer is a topological insulator layer being subjected to an electrical potential.

9. The electrical device of claim 3, wherein the layer of topological material comprises a 3D topological insulator variant layer being subjected to an electrical potential, wherein upon the application of the electrical potential to the 3D topological insulator variant layer, the surface states of the 3D topological insulator variant layer become a topological insulator or a trivial insulator having a gapped energy band gap or appreciable energy band gap.

10. The electrical device of claim 1, wherein the topological insulator layer is a 2D or 3D topological insulator layer containing magnetic doping, wherein the topological material is connected in a programmable circuit such that a field applied to the topological material changes a magnetic domain formed by the magnetic doping to control a conductivity of the topological material, thereby selectively forming an electrical connection in the programmable circuit.

11. The electrical device of claim 10, wherein the topological insulator layer contains surface magnetic doping.

12. The electrical device of claim 10, wherein the topological insulator layer is a topological insulator layer containing magnetic doping at the surface and in the bulk of the topological material.

13. The electrical device of claim 1, wherein the quantum anomalous hall insulator layer has an insulating energy band gap in the bulk and gapless chiral edge states protected by the first Chern number.

14. The electrical device of claim 1, wherein the topological insulator layer comprises a three-dimensional topological magnetic insulator layer wherein an antiferromagnetic order breaks the time-reversal symmetry of an insulator layer spontaneously and magnetic fluctuations of the topological magnetic insulator layer are coupled linearly to an axion field.

15. The electrical device of claim 1, wherein the current transport layer forms a conductive wire on the integrated circuit being configured as an interconnect between the first circuit and the second circuit, wherein the conductive wire comprises two spatially separated edge channels in the topological material, each edge channel carrying charge carriers propagating in one direction only, the two edge channels carrying charge carriers propagating in opposite directions.

16. The electrical device of claim 15, wherein the layer of the topological material forming the conductive wire comprises a two-dimensional quantum anomalous hall insulator layer with an insulating energy band gap in the bulk and gapless chiral edge states protected by the first Chern number, the chiral edge state being an edge state that carries current uni-directionally, the two-dimensional quantum anomalous hall insulator layer being formed a first distance away from a ground plate or a second wire, the load having a second terminal coupled to the ground plate or to the second wire.

17. The electrical device of claim 15, wherein the layer of the topological material comprises a three-dimensional topological insulator variant layer with magnetic doping, the three-dimensional topological insulator variant layer being a material with an insulating energy band gap in the bulk and the magnetic doping of the topological insulator variant layer breaking the time-reversal symmetry of the surface states, wherein the three-dimensional topological insulator variant layer with magnetic doping includes a first region of a first magnetic domain and a second region of a second magnetic domain, the second magnetic domain being opposite to the first magnetic domain, the first and second regions being formed by magnetic doping of the topological insulator variant layer, and wherein the conductive wire comprises an axion string interconnect formed at the boundary between the first region and the second region.

18. The electrical device of claim 17, wherein the axion string interconnect comprises a programmable interconnect where programming of the axion string interconnect is realized by changing the polarities of the first and second magnetic domains.

19. The electrical device of claim 1, wherein the current transport layer comprises a transparent electrode.

* * * * *